(12) United States Patent
Park et al.

(10) Patent No.: US 12,074,170 B2
(45) Date of Patent: Aug. 27, 2024

(54) DISPLAY DEVICE AND TILED DISPLAY DEVICE INCLUDING THE SAME

(71) Applicant: Samsung Display Co., Ltd., Yongin-si (KR)

(72) Inventors: Cheol Min Park, Hwaseong-si (KR); Yi Joon Ahn, Seoul (KR); Atsushi Nemoto, Suwon-si (KR); Woo Suk Seo, Yongin-si (KR); Eun Kyung Yeon, Suwon-si (KR); Jae Been Lee, Seoul (KR); Tae Ho Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 231 days.

(21) Appl. No.: 17/451,028

(22) Filed: Oct. 15, 2021

(65) Prior Publication Data

US 2022/0173126 A1 Jun. 2, 2022

(30) Foreign Application Priority Data

Dec. 2, 2020 (KR) ........................ 10-2020-0166239

(51) Int. Cl.
*H01L 27/12* (2006.01)
*H01L 25/16* (2023.01)

(52) U.S. Cl.
CPC ........ *H01L 27/1218* (2013.01); *H01L 25/162* (2013.01); *H01L 25/167* (2013.01); *H01L 27/124* (2013.01)

(58) Field of Classification Search
CPC . H01L 25/167; H01L 25/162; H01L 27/1218; H01L 27/124; H01L 27/156; H10K 59/38
See application file for complete search history.

(56) References Cited

U.S. PATENT DOCUMENTS

| 10,103,179 B2 | 10/2018 | Kwon et al. |
| 2016/0105950 A1 | 4/2016 | Drzaic et al. |
| 2017/0256599 A1* | 9/2017 | Kim ...................... H01L 27/124 |

(Continued)

FOREIGN PATENT DOCUMENTS

| CN | 110310577 A | 10/2019 |
| KR | 10-2018-0007048 A | 1/2018 |

(Continued)

*Primary Examiner* — Peter M Albrecht
(74) *Attorney, Agent, or Firm* — Lewis Roca Rothgerber Christie LLP

(57) ABSTRACT

A tiled display device includes a plurality of display devices including a plurality of display areas including pixels, and a coupling area between adjacent display areas from among the plurality of display areas. Each of the plurality of display devices includes: a substrate including a first portion configured to support the display area, a second portion extending from the first portion to be bent, and a third portion extending from the second portion, a display layer on the first portion of the substrate and including the pixels, a connection line at an edge of the first portion of the substrate and connected to the plurality of pixels, a pad portion on the third portion of the substrate, a fan-out line on the second portion of the substrate and connected between the pad portion and the connection line, and pattern holes penetrating the second portion of the substrate.

23 Claims, 21 Drawing Sheets

(56) References Cited

U.S. PATENT DOCUMENTS

| | | | |
|---|---|---|---|
| 2019/0157362 A1* | 5/2019 | Rho | H10K 59/38 |
| 2019/0179466 A1* | 6/2019 | Kim | G06F 3/0412 |
| 2020/0159054 A1* | 5/2020 | Jeong | G02F 1/13336 |
| 2020/0203459 A1 | 6/2020 | Wang et al. | |
| 2020/0411492 A1* | 12/2020 | Ju | H01L 25/167 |
| 2022/0045124 A1 | 2/2022 | Lee et al. | |
| 2022/0384492 A1* | 12/2022 | Lu | H01L 25/167 |

FOREIGN PATENT DOCUMENTS

| KR | 10-2033625 B1 | 10/2019 |
|---|---|---|
| KR | 10-2022-0018122 A | 2/2022 |

* cited by examiner

DISPLAY DEVICE AND TILED DISPLAY DEVICE INCLUDING THE SAME

CROSS-REFERENCE TO RELATED APPLICATION

This application claims priority to and the benefit of Korean Patent Application No. 10-2020-0166239 filed on Dec. 2, 2020, in the Korean Intellectual Property Office, the entire content of which is incorporated herein by reference.

BACKGROUND

1. Field

The present disclosure relates to a display device and a tiled display device including the same.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. The display device may be a flat panel display device such as a liquid crystal display device, a field emission display device and an organic light emitting display device. Among the flat panel display devices, in the light emitting display device, because each of the pixels of a display panel includes a light emitting element capable of emitting light by itself, an image can be displayed without a backlight unit providing light to the display panel.

When the display device is manufactured in a large size, a defect rate of the light emitting elements may increase due to an increase in the number of pixels, thereby deteriorating productivity or reliability of the display device. To solve this problem, in a tiled display device, a large-sized screen may be implemented by connecting a plurality of display devices having a relatively small size. The tiled display device may include a boundary portion called a seam between the plurality of display devices, due to a non-display area or a bezel area of each of the plurality of display devices adjacent to each other. When a single image is displayed on the entire screen, the boundary portion between the plurality of display devices gives a sense of disconnection over the entire screen, thereby reducing a sense of immersion in the image.

SUMMARY

Aspects of embodiments of the present disclosure provide a tiled display device capable of reducing or minimizing a boundary portion or a non-display area between a plurality of display devices by bending a bent portion of a substrate and bonding a flexible film and a source driver at the rear surface of the substrate, and a tiled display device including the same.

Aspects of embodiments of the present disclosure also provide a tiled display device capable of removing a sense of disconnection between a plurality of display devices and improving a sense of immersion in an image, by preventing or reducing the recognition of boundary portions or non-display areas between the plurality of display devices.

However, aspects of embodiments of the present disclosure are not restricted to those set forth herein. The above and other aspects of embodiments of the present disclosure will become more apparent to one of ordinary skill in the art to which the present disclosure pertains by referencing the detailed description of the present disclosure given below.

According to an embodiment of the present disclosure, a tiled display device includes a plurality of display devices including a plurality of display areas including a plurality of pixels, and a coupling area between adjacent display areas from among the plurality of display areas. Each of the plurality of display devices includes: a substrate including a first portion configured to support the display area, a second portion extending from the first portion to be bent, and a third portion extending from the second portion, a display layer on the first portion of the substrate and including the plurality of pixels, a connection line at an edge of the first portion of the substrate and connected to the plurality of pixels, a pad portion on the third portion of the substrate, a fan-out line on the second portion of the substrate and connected between the pad portion and the connection line, and a plurality of pattern holes penetrating the second portion of the substrate.

The second portion of the substrate of each of the plurality of display devices may be at the coupling area.

The third portion of the substrate may overlap the first portion of the substrate in a thickness direction of the substrate.

Each of the plurality of display devices may further include: a flexible film on the pad portion, and a source driver on the flexible film to drive the plurality of pixels.

The fan-out line may be bent to bypass the plurality of pattern holes in a plan view.

The second portion of the substrate may be bent along a bending axis in a first direction. A width of each of the plurality of pattern holes in the first direction may be greater than a width of each of the plurality of pattern holes in a second direction crossing the first direction.

The plurality of pattern holes may have a circular shape.

Each of the plurality of display devices may further include a protective film covering the fan-out line.

A thickness of the second portion of the substrate may be less than a thickness of the first portion of the substrate or a thickness of the third portion of the substrate.

A bottom surface of the second portion of the substrate may have a stepped portion recessed from a bottom surface of the first portion of the substrate.

Each of the plurality of display devices may further include a support part configured to support the second portion of the substrate and to attach one surface of the third portion of the substrate to one surface of the first portion of the substrate.

A top surface of the second portion of the substrate may have a stepped portion recessed from a top surface of the first portion of the substrate.

Each of the plurality of display devices may further include a filling part filled in the plurality of pattern holes.

The fan-out line may extend on a top surface of the filling part.

The second portion of the substrate may include: a second-first portion extending from the first portion of the substrate to be bent, a second-second portion extending from the second-first portion, and a second-third portion extending from the second-second portion to be bent. The plurality of pattern holes may be configured to penetrate the second-first portion and the second-third portion.

According to an embodiment of the present disclosure, a tiled display device includes a plurality of display devices including a plurality of display areas including a plurality of pixels, and a coupling area between adjacent display areas from among the plurality of display areas. Each of the plurality of display devices includes: a first substrate configured to support the display area, a second substrate including a first portion on one surface of the first substrate, a second portion extending from the first portion to be bent, and a third portion extending from the second portion, a display layer on the first substrate and including the plurality of pixels, a connection line at an edge on the first substrate and connected to the plurality of pixels, a pad portion on the third portion of the second substrate, and a fan-out line on the second portion of the second substrate and connected between the pad portion and the connection line.

The first portion of the second substrate may be on a bottom surface of the first substrate. The fan-out line may extend along a side surface of the first substrate to an upper portion of the connection line.

Each of the plurality of display devices may further include a cover film on a bottom surface of the second substrate.

The first portion of the second substrate may be on a top surface of the first substrate, the second portion of the second substrate may be supported by a side surface of the first substrate, and the third portion of the second substrate may be attached to a bottom surface of the first substrate.

Each of the plurality of display devices may further include a cover film on a top surface of the second substrate.

According to an embodiment of the present disclosure, a display device includes: a substrate including a first portion, a second portion extending from the first portion to be bent, and a third portion extending from the second portion, a thin film transistor layer on the first portion of the substrate and including a thin film transistor, a light emitting element layer on the thin film transistor layer and including a light emitting element connected to the thin film transistor, a wavelength conversion layer on the light emitting element layer to convert a peak wavelength of light provided from the light emitting element, a connection line at an edge on the first portion of the substrate and connected to the thin film transistor, a pad portion on the third portion of the substrate, a fan-out line on the second portion of the substrate and connected between the pad portion and the connection line, and a plurality of pattern holes penetrating the second portion of the substrate.

The light emitting element layer may include: a first electrode on the thin film transistor layer, a second electrode at a same layer as the first electrode and spaced from the first electrode, and a light emitting diode located between the first electrode and the second electrode.

The wavelength conversion layer may include: a first wavelength conversion part configured to convert the peak wavelength of light provided from the light emitting element into a first peak wavelength, a second wavelength conversion part configured to convert the peak wavelength of light provided from the light emitting element into a second peak wavelength different from the first peak wavelength, and a light transmission part configured to allow the light to pass therethrough while maintaining the peak wavelength of the light provided from the light emitting element.

A thickness of the second portion of the substrate may be less than a thickness of the first portion of the substrate or a thickness of the third portion of the substrate.

A bottom surface of the second portion of the substrate may have a stepped portion recessed from a bottom surface of the first portion of the substrate.

The display device may further include a support part configured to support the second portion of the substrate and to attach one surface of the third portion of the substrate to one surface of the first portion of the substrate.

A top surface of the second portion of the substrate may have a stepped portion recessed from a top surface of the first portion of the substrate.

The display device may further include a filling part filled in the plurality of pattern holes. The fan-out line may extend on a top surface of the filling part.

According to an embodiment of the display device and the tiled display device including the same, by bending a substrate in a coupling area between a plurality of display devices, a flexible film and a source driver may be bonded at the rear surface of the substrate, and the width of the coupling area or the distance between the plurality of display devices may be small enough that it is not recognized by a user. The display device and the tiled display device including the same include a plurality of pattern holes penetrating the bent portion of the substrate, thereby improving ring-on-ring (ROR) strength and bending strength of the substrate. Accordingly, in the tiled display device, the coupling area may be prevented from being recognized by the user, thereby removing a sense of disconnection between the plurality of display devices and improving a sense of immersion in the image.

It should be noted that the aspects and features of embodiments of the present disclosure are not limited to those described above, and other aspects and features of embodiments of the present disclosure will be apparent from the following description.

BRIEF DESCRIPTION OF THE DRAWINGS

The above and other aspects and features of embodiments of the present disclosure will become more apparent by describing in detail embodiments thereof with reference to the attached drawings, in which.

DETAILED DESCRIPTION

Figure 1:
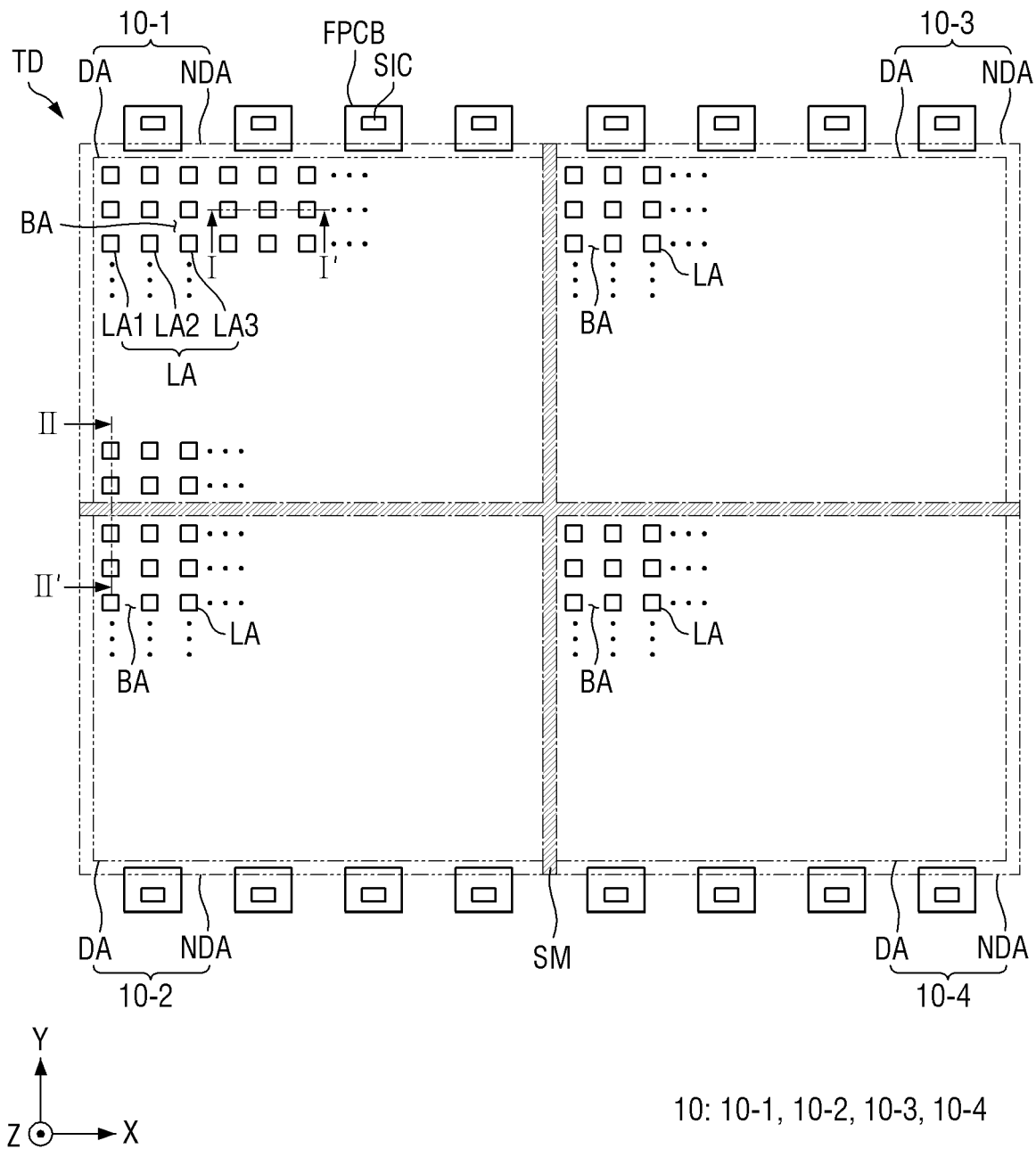
FIG. 1 is a plan view illustrating a tiled display device according to one embodiment.

In the following description, for the purposes of explanation, numerous details are set forth in order to provide a thorough understanding of various embodiments or implementations of the disclosure. As used herein "embodiments" and "implementations" are interchangeable words that are non-limiting examples of devices or methods employing one or more of the implementations or embodiments disclosed herein. It is apparent, however, that various embodiments may be practiced without these details or with one or more equivalent arrangements. In other instances, structures and devices may be shown in block diagram form in order to avoid unnecessarily obscuring various embodiments. Further, various embodiments may be different, but do not have to be exclusive. For example, shapes, configurations, and characteristics of an embodiment may be used or implemented in another embodiment without departing from the scope of the disclosure.

Unless otherwise specified, the illustrated embodiments are to be understood as providing features of varying detail of some or a number of ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the scope of the present disclosure.

The use of cross-hatching and/or shading in the accompanying drawings is generally provided to clarify boundaries between adjacent elements. As such, neither the presence nor the absence of cross-hatching or shading conveys or indicates any preference or requirement for materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be substantially perpendicular to one another, or may represent different directions that may not be perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

The terms "and" and "or" may be used in the conjunctive or disjunctive sense and may be understood to be equivalent to "and/or."

Although the terms "first," "second," etc. may be used herein to describe various types of elements, these elements should not be limited by these terms. These terms are used to distinguish one element from another element. Thus, a first element discussed below could be termed a second element without departing from the teachings of the present disclosure.

Spatially relative terms, such as "beneath," "below," "under," "lower," "above," "upper," "over," "higher," "side" (for example, as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (for example, rotated 90 degrees or about 90 degrees or at other orientations), and, as such, the spatially relative descriptors used herein interpreted accordingly.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' or "not to overlap" another element, this may include that the elements are spaced from each other, offset from each other, or set aside from each other or any other suitable term as would be appreciated and understood by those of ordinary skill in the art.

The terms "face" and "facing" may mean that a first element may directly or indirectly oppose a second element. In a case in which a third element intervenes between the first and second element, the first and second element may be understood as being indirectly opposed to one another, although still facing each other.

The terminology used herein is for the purpose of describing embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," "has," and/or "having," and/or variations thereof when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

For example, "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Some or a number of embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (for example, microcode) to perform various functions discussed herein and may optionally be driven by firmware and/or software. It is also contemplated that each block, unit, and/or module may be implemented by dedicated hardware, or as a combination of dedicated hardware to perform some or a number of functions and a processor (for example, one or more programmed microprocessors and associated circuitry) to perform other functions. Also, each block, unit, and/or module of some or a number of embodiments may be physically separated into two or more interacting and discrete blocks, units, and/or modules without departing from the scope of the present disclosure. Further, the blocks, units, and/or modules of some or a number of embodiments may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view illustrating a tiled display device according to one embodiment.

Referring to FIG. 1, a tiled display device TD may include a plurality of display devices 10. The plurality of display devices 10 may be arranged in a grid form, but are not limited thereto. The plurality of display devices 10 may be connected in a first direction (X-axis direction) or a second direction (Y-axis direction), and the tiled display device TD may have a particular shape. For example, the plurality of display devices 10 may have the same size, but the present disclosure is not limited thereto. For another example, the plurality of display devices 10 may have different sizes.

Each of the plurality of display devices 10 may have a rectangular shape including long sides and short sides. The plurality of display devices 10 may be arranged such that the long sides or the short sides thereof are connected to each other. Some of the plurality of display devices 10 may be disposed at the edge of the tiled display device TD to form one side of the tiled display device TD. Some other ones of the plurality of display devices 10 may be disposed at corners of the tiled display device TD to form two adjacent sides of the tiled display device TD. Yet some other ones of the plurality of display devices 10 may be disposed on the inner side of the tiled display device TD, and may be surrounded by other display devices 10.

Each of the plurality of display devices 10 may include a display area DA and a non-display area NDA. The display area DA may include a plurality of pixels to display an image. The non-display area NDA may be disposed around the display area DA to surround the display area DA along an edge or periphery of the display area DA, and may not display an image.

The tiled display device TD may have a planar shape as a whole, but is not limited thereto. The tiled display device TD may have a three-dimensional shape to provide a three-dimensional effect to a user. For example, when the tiled display device TD has a three-dimensional shape, at least some of the plurality of display devices 10 may have a curved shape. For another example, the plurality of display devices 10 may each have a planar shape and may be connected to each other at a suitable angle (e.g., a set or predetermined angle), so that the tiled display device TD may have a three-dimensional shape.

The tiled display device TD may include a coupling area SM disposed between a plurality of display areas DA. The tiled display device TD may be formed by connecting non-display areas NDA of the adjacent display devices 10. The plurality of display devices 10 may be connected to each other through a bonding member or an adhesive member disposed in the coupling area SM. The distance between the display areas DA of the plurality of display devices 10 may be small enough that the coupling area SM between the plurality of display devices 10 is not recognized by the user. In addition, the reflectance of external light of the display areas DA of the plurality of display devices 10 may be substantially the same as that of the coupling area SM between the plurality of display devices 10. Accordingly, in the tiled display device TD, the coupling area SM between the plurality of display devices 10 may be prevented from being recognized by the user, thereby removing or reducing a sense of disconnection between the plurality of display devices 10 and improving a sense of immersion in an image.

Each of the plurality of display devices 10 may include a plurality of pixels arranged along a plurality of rows and columns in the display area DA. Each of the plurality of pixels may include an emission area LA defined by a pixel defining layer or bank, and may emit light having a peak wavelength (e.g., a set or predetermined peak wavelength) through the emission area LA. For example, the display area DA of the display device 10 may include first to third emission areas LA1, LA2, and LA3. Each of the first to third emission areas LA1, LA2, and LA3 may be an area in which light generated from a light emitting element of the display device 10 is emitted to the outside of the display device 10.

The first to third emission areas LA1, LA2, and LA3 each may emit light having a set peak wavelength (or a predetermined peak wavelength) to the outside of the display device 10. The first emission area LA1 may emit light of a first color, the second emission area LA2 may emit light of a second color, and the third emission area LA3 may emit light of a third color. For example, the first color light may be red light having a peak wavelength in the range from 610 nm to 650 nm, the second color light may be green light having a peak wavelength in the range from 510 nm to 550 nm, and the third color light may be blue light having a peak wavelength in the range from 440 nm to 480 nm, but the present disclosure is not limited thereto.

The first to third emission areas LA1, LA2, and LA3 may be sequentially arranged repetitively along the first direction (X-axis direction) in the display area DA. For example, the first emission area LA1 may be larger in size than the second emission area LA2, and the second emission area LA2 may be larger in size than the third emission area LA3. For another example, the first emission area LA1, the second emission area LA2, and the third emission area LA3 may be substantially the same in size.

The display area DA of the display device 10 may include a light blocking area BA surrounding the plurality of emission areas LA. The light blocking area BA may prevent the colored lights emitted from the first to third emission areas LA1, LA2, and LA3 from mixing with one another.

The tiled display device TD may include first to fourth display devices 10-1 to 10-4. The number and connection relationship of the display devices 10 are not limited to the embodiment of FIG. 1. The number of the display devices 10 may be determined according to the size of each of the display devices 10 and the tiled display device TD.

A flexible film FPCB may be disposed on the non-display area NDA provided on one side of the tiled display device TD. For example, the flexible film FPCB may be disposed in the non-display area NDA on the upper side of the first display device 10-1, the non-display area NDA on the lower side of the second display device 10-2, the non-display area NDA on the upper side of the third display device 10-3, and the non-display area NDA on the lower side of the fourth display device 10-4. The flexible film FPCB may be attached to a pad portion disposed on a substrate of each of the first to fourth display devices 10-1, 10-2, 10-3, and 10-4. One side of the flexible film FPCB may be connected to the pad portion, and the other side of the flexible film FPCB may be connected to a source circuit board. The flexible film FPCB may transmit a source voltage or data voltage of a source driver SIC to the display device 10.

The source driver SIC may be disposed on the flexible film FPCB, and may be connected to the plurality of pixels of the display device 10. For example, the source driver SIC may be an integrated circuit (IC). In response to a source control signal of a timing controller, the source driver SIC may convert digital video data into an analog data voltage, and may supply it to a data line of the display area DA through the flexible film FPCB.

Figure 2:
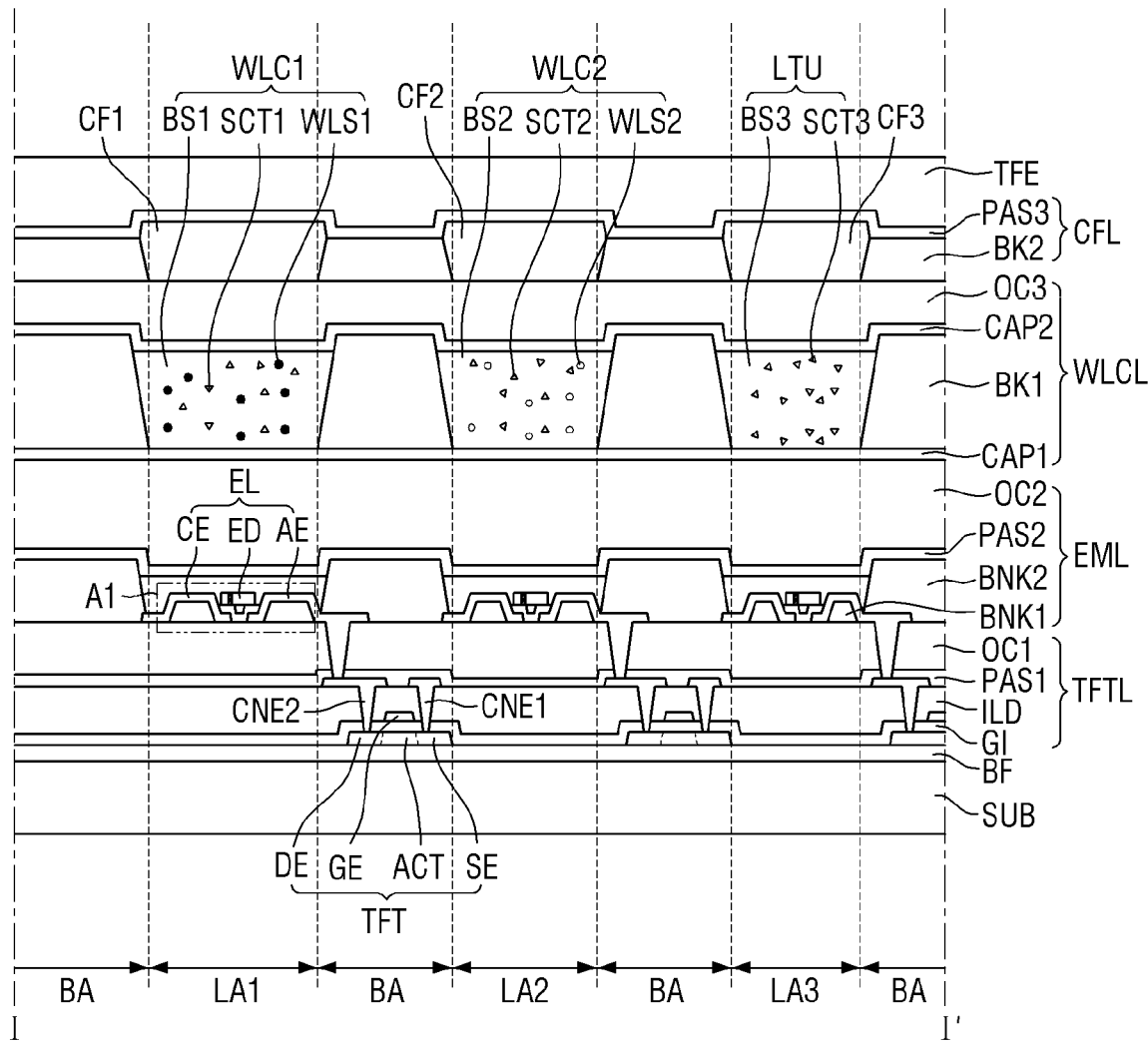
FIG. 2 is a cross-sectional view taken along the line I-I' of FIG. 1.

FIG. 2 is a cross-sectional view taken along the line I-I' of FIG. 1.

Referring to FIG. 2, the display area DA of the display device 10 may include the first to third emission areas LA1, LA2, and LA3. Each of the first to third emission areas LA1, LA2, and LA3 may be an area in which light generated from a light emitting diode ED of each of the plurality of pixels is emitted to the outside of the display device 10.

The display device 10 may include a substrate SUB, a thin film transistor layer TFTL, a light emitting element layer EML, a wavelength conversion layer WLCL, a color filter layer CFL, and an encapsulation layer TFE.

The substrate SUB may be a base substrate or a base member, and may be made of an insulating material such as a polymer resin. The substrate SUB may be a flexible substrate that can be bent, folded and/or rolled. For example, the substrate SUB may include a glass material or a metal material, but is not limited thereto. For another example, the substrate SUB may include polyimide (PI).

The thin film transistor layer TFTL may be disposed on the substrate SUB. The thin film transistor layer TFTL may include a buffer layer BF, a thin film transistor TFT, a gate insulating layer GI, an interlayer insulating layer ILD, a first connection electrode CNE1, a second connection electrode CNE2, a first passivation layer PAS1, and a first planarization layer OC1.

The buffer layer BF may be disposed on the substrate SUB. The buffer layer BF may be formed of an inorganic material capable of preventing infiltration of air or moisture. For example, the buffer layer BF may include a plurality of inorganic films laminated alternately.

The thin film transistor TFT may be disposed on the buffer layer BF, and may constitute a pixel circuit of each of the plurality of pixels. For example, the thin film transistor TFT may be a switching transistor or a driving transistor of the pixel circuit. The thin film transistor TFT may include a semiconductor region ACT, a gate electrode GE, a source electrode SE, and a drain electrode DE.

The semiconductor region ACT, the source electrode SE, and the drain electrode DE may be disposed on the buffer layer BF. The semiconductor region ACT may overlap the gate electrode GE in the thickness direction of the substrate SUB (or the Z-axis direction), and may be insulated from the gate electrode GE by the gate insulating layer GI that is disposed over the buffer layer BF and the semiconductor region ACT, the source electrode SE, and the drain electrode DE of the thin film transistor TFT. The source electrode SE and the drain electrode DE may be provided by making a material of the semiconductor region ACT conductive.

The gate electrode GE may be disposed on the gate insulating layer GI. The gate electrode GE may overlap the semiconductor region ACT in the thickness direction of the substrate SUB (or the Z-axis direction) with the gate insulating layer GI interposed therebetween.

The gate insulating layer GI may be provided on the semiconductor region ACT, the source electrode SE, and the drain electrode DE. For example, the gate insulating layer GI may cover the semiconductor region ACT, the source electrode SE, the drain electrode DE, and the buffer layer BF, and may insulate the semiconductor region ACT from the gate electrode GE. The gate insulating layer GI may include at least one contact hole through which the connection electrode CNE passes. For example the gate insulating layer GI may include corresponding contact holes to pass each of the connection electrodes CNE1 and CNE2 of the thin film transistor TFT.

The interlayer insulating layer (or interlayer dielectric layer) ILD may be disposed on the gate electrode GE and the gate insulating layer GI. For example, the interlayer insulating layer ILD may include contact holes through which the first and second connection electrodes CNE1 and CNE2 pass. Here, the contact holes of the interlayer insulating layer ILD may be connected to the corresponding contact holes of the gate insulating layer GI.

The first and second connection electrodes CNE1 and CNE2 may be disposed to be spaced from each other on the interlayer insulating layer ILD. The first connection electrode CNE1 may connect the data line to the source electrode SE of the thin film transistor TFT. The first connection electrode CNE1 may be in contact with the source electrode SE through the corresponding contact holes provided in the gate insulating layer GI and the interlayer insulating layer ILD.

The second connection electrode CNE2 may connect the drain electrode DE of the thin film transistor TFT to a first electrode AE of a light emitting element. The second connection electrode CNE2 may be in contact with the drain electrode DE through the corresponding contact holes provided in the gate insulating layer GI and the interlayer insulating layer ILD.

The first passivation layer PAS1 may be provided on the first and second connection electrodes CNE1 and CNE2 to protect the thin film transistor TFT. The first passivation layer PAS1 may also be provided on the interlayer insulating layer ILD. For example, the first passivation layer PAS1 may include a contact hole through which the first electrode AE of the light emitting element EL passes to be in contact with the second connection electrode CNE2 to connect to the drain electrode DE of the thin film transistor TFT.

The first planarization layer OC1 may be provided on the first passivation layer PAS1 to planarize a top portion of the thin film transistor layer TFTL. For example, the first planarization layer OC1 may include a contact hole through which the first electrode AE of the light emitting element EL passes. Here, the contact hole of the first planarization layer OC1 may be connected to the contact hole of the first passivation layer PAS1. The first planarization layer OC1 may include an organic material.

The light emitting element layer EML may include at least one light emitting element EL, at least one first bank BNK1, at least one second bank BNK2, a second passivation layer PAS2, and a second planarization layer OC2.

The light emitting element EL may be provided on the thin film transistor TFT. The light emitting element EL may include the first electrode AE, a second electrode CE, and the light emitting diode ED.

The first electrode AE may be provided on the first planarization layer OC1. For example, the first electrode AE may be disposed on the first bank BNK1 disposed on the first planarization layer OC1 to cover the first bank BNK1. The first electrode AE may be disposed to overlap one of the first to third emission areas LA1, LA2, and LA3 defined by the second bank BNK2. Further, the first electrode AE may be connected to the drain electrode DE of the thin film transistor TFT via the second connection electrode CNE2. The first electrode AE may be an anode electrode of the light emitting element EL, but is not limited thereto.

The second electrode CE may be disposed on the first planarization layer OC1 to be spaced from the first electrode AE in the X axis direction. For example, the second electrode CE may be disposed on the first bank BNK1 disposed on the first planarization layer OC1 to cover the first bank BNK1. The second electrode CE may be disposed to overlap one of the first to third emission areas LA1, LA2, and LA3 defined by the second bank BNK2. For example, the second electrode CE may receive a common voltage supplied to all pixels. The second electrode CE may be a cathode electrode of the light emitting element EL, but is not limited thereto.

The light emitting diode ED may be disposed between the first electrode AE and the second electrode CE on the first planarization layer OC1. One end of the light emitting diode ED may be connected to the first electrode AE, and the other end of the light emitting diode ED may be connected to the second electrode CE. For example, a plurality of light emitting diodes ED may include active layers having the same material and emit light of the same wavelength band or light of the same color. Light emitted from each of the first to third emission areas LA1, LA2, and LA3 may have the same color. For example, the light emitting diodes ED may emit the third color light or blue light having a peak wavelength in the range of 440 nm to 480 nm. Therefore, the light emitting element layer EML may emit the third color light or blue light.

The second bank BNK2 may be disposed on the first planarization layer OC1 to define the first to third emission areas LA1, LA2, and LA3. For example, the second bank BNK2 may surround each of the first to third emission areas LA1, LA2, and LA3, but is not limited thereto. The second bank BNK2 may separate and insulate the first electrode AE or the second electrode CE of each of a plurality of light emitting elements EL. The second bank BNK2 may be disposed in the light blocking area BA.

The second passivation layer PAS2 may be disposed on the plurality of light emitting elements EL and the second bank BNK2. The second passivation layer PAS2 may cover the plurality of light emitting elements and may protect the plurality of light emitting elements. The second passivation layer PAS2 may prevent infiltration of impurities such as moisture or air from the outside to prevent damage to the plurality of light emitting elements.

The second planarization layer OC2 may be provided on the second passivation layer PAS2 to planarize a top portion of the light emitting element layer EML. For example, the second planarization layer OC2 may include an organic material.

The wavelength conversion layer WLCL may include a first capping layer CAP1, a first light blocking member BK1, a first wavelength conversion part WLC1, a second wavelength conversion part WLC2, a light transmission part LTU, a second capping layer CAP2, and a third planarization layer OC3.

The first capping layer CAP1 may be disposed on the second planarization layer OC2 of the light emitting element layer EML. The first capping layer CAP1 may seal the bottom surfaces of the light transmission part LTU and the first and second wavelength conversion parts WLC1 and WLC2. For example, the first capping layer CAP1 may include an inorganic material.

The first light blocking member BK1 may be disposed on the light blocking area BA on the first capping layer CAP1. The first light blocking member BK1 may overlap the second bank BNK2 in the thickness direction of the substrate SUB. The first light blocking member BK1 may block transmission of light. The first light blocking member BK1 may prevent light infiltration and color mixture between the first to third emission areas LA1, LA2, and LA3, which leads to the improvement of color reproducibility of the display device 10. The first light blocking member BK1 may be arranged in the form of a grid surrounding the first to third emission areas LA1, LA2, and LA3 in plan view.

The first light blocking member BK1 may include an organic light blocking material and a lyophobic component. For example, the first light blocking member BK1 may be made of a black organic material including the lyophobic component. The first light blocking member BK1 may be formed through a coating and exposure process of an organic light blocking material including the lyophobic component.

The first wavelength conversion part WLC1 may be disposed in the first emission area LA1 on the first capping layer CAP1. The first wavelength conversion part WLC1 may be surrounded by the first light blocking member BK1. The first wavelength conversion part WLC1 may include a first based resin BS1, a first scatterer SCT1, and a first wavelength shifter WLS1.

The first base resin BS1 may contain a material having a relatively high light transmittance. The first base resin BS1 may be formed of a transparent organic material. For example, the first base resin BS1 may contain at least one of organic materials such as epoxy resin, acrylic resin, cardo resin, or imide resin.

The first scatterer SCT1 may have a refractive index different from that of the first base resin BS1 and form an optical interface with the first base resin BS1. For example, the first scatterer SCT1 may contain a light scattering material or light scattering particles that scatter at least a part of the transmitted light. For example, the first scatterer SCT1 may contain a metallic oxide such as titanium oxide ($TiO_2$), zirconium oxide ($ZrO_2$), aluminum oxide ($AL_2O_3$), indium oxide ($In_2O_3$), zinc oxide (ZnO), or tin oxide ($SnO_2$), or may contain organic particles such as acrylic resin and urethane resin. The first scatterer SCT1 may scatter light in random directions regardless of the incidence direction of the incident light without any substantial change of the peak wavelength of the incident light.

The first wavelength shifter WLS1 may change or shift the peak wavelength of the incident light to a first peak wavelength. For example, the first wavelength shifter WLS1 may convert blue light provided from the display device 10 into red light having a single peak wavelength in the range of 610 nm to 650 nm and emit the red light. The first wavelength shifter WLS1 may be a quantum dot, a quantum rod, or a fluorescent substance. The quantum dot may be a particulate material that emits light of a specific color when an electron transitions from a conduction band to a valence band.

A part of the blue light emitted from the light emitting element layer EML may pass through the first wavelength conversion part WLC1 without being converted to red light by the first wavelength shifter WLS1. As a part of the blue light emitted from the light emitting element layer EML, the light incident on the first color filter CF1 without being converted by the first wavelength conversion part WLC1 may be blocked by the first color filter CF1. The red light produced by the first wavelength conversion portion WLC1 converting the blue light emitted from the light emitting element layer EML may pass through the first color filter CF1 to be emitted to the outside. Accordingly, the red light may be emitted through the first emission area LA1.

The second wavelength conversion part WLC2 may be disposed in the second emission area LA2 on the first capping layer CAP1. The second wavelength conversion part WLC2 may be surrounded by the first light blocking member BK1. The second wavelength conversion part WLC2 may include a second base resin BS2, a second scatterer SCT2, and a second wavelength shifter WLS2.

The second base resin BS2 may contain a material having a relatively high light transmittance. The second base resin BS2 may be formed of a transparent organic material. For example, the second base resin BS2 may be made of the same material as the first base resin BS1, or may be made of the material that is, for example, in association with the first base resin BS1.

The second scatterer SCT2 may have a refractive index different from that of the second base resin BS2 and form an optical interface with the second base resin BS2. For example, the second scatterer SCT2 may contain a light scattering material or light scattering particles scattering at least a part of the transmitted light. For example, the second scatterer SCT2 may be made of the same material as the first scatterer SCT1, or may be made of the material that is, for example, in association with the first scatterer SCT1. The second scatterer SCT2 may scatter the light in random directions regardless of the incidence direction of the incident light without any substantial change of the peak wavelength of the incident light.

The second wavelength shifter WLS2 may change or shift the peak wavelength of the incident light to a second peak wavelength different from the first peak wavelength of the first wavelength shifter WLS1. For example, the second wavelength shifter WLS2 may convert blue light provided from the display device 10 into green light having a single peak wavelength in the range of 510 nm to 550 nm and emit the green light. The second wavelength shifter WLS2 may be a quantum dot, a quantum rod, or a fluorescent substance. The second wavelength shifter WLS2 may contain the materials identical in purpose with the materials enumerated in association with the first wavelength shifter WLS1. The second wavelength shifter WLS2 may be formed of a quantum dot, a quantum rod, or a fluorescent substance to have a wavelength conversion range different from that of the first wavelength shifter WLS1.

The light transmission part LTU may be disposed in the third emission area LA3 on the first capping layer CAP1. The light transmission part LTU may be surrounded by the first light blocking member BK1. The light transmission part LTU may allow the incident light to pass therethrough while maintaining the peak wavelength of the light. The light transmission part LTU may include a third base resin BS3 and a third scatterer SCT3.

The third base resin BS3 may contain a material having a relatively high light transmittance. The third base resin BS3 may be formed of a transparent organic material. For example, the third base resin BS3 may be made of the same material as the first base resin BS1 or the second base resin BS2, or may be made of the material that is, for example, in association with the first base resin BS1 or the second base resin BS2.

The third scatterer SCT3 may have a refractive index different from that of the third base resin BS3 and form an optical interface with the third base resin BS3. For example, the third scatterer SCT3 may contain a light scattering material or light scattering particles scattering at least a part of the transmitted light. For example, the third scatterer SCT3 may be formed of the same material as the first scatterer SCT1 or the second scatterer SCT2, or may be made of the material that is, for example, in association with the first scatterer SCT1 or the second scatterer SCT2. The third scatterer SCT3 may scatter the light in random directions regardless of the incidence direction of the incident light without any substantial change of the peak wavelength of the incident light.

Because the wavelength conversion layer WLCL is disposed directly on the second planarization layer OC2 of the light emitting element layer EML, the display device 10 may not require a separate substrate for the first and second wavelength conversion parts WLC1 and WLC2 and the light transmission part LTU. Accordingly, the first and second wavelength conversion parts WLC1 and WLC2 and the light transmission part LTU may be easily aligned in the first to third emission areas LA1, LA2, and LA3, respectively, and the thickness of the display device 10 may be relatively reduced.

The second capping layer CAP2 may cover the first and second wavelength conversion parts WLC1 and WLC2, the light transmission part LTU, and the first light blocking member BK1. For example, the second capping layer CAP2 may seal the first and second wavelength conversion parts WLC1 and WLC2 and the light transmission part LTU to prevent the first and second wavelength conversion parts WLC1 and WLC2 and the light transmission part LTU from damage or contamination. For example, the second capping layer CAP2 may include an inorganic material.

The third planarization layer OC3 may be disposed on the second capping layer CAP2 to planarize top portions of the first and second wavelength conversion parts WLC1 and WLC2 and the light transmission part LTU. For example, the third planarization layer OC3 may include an organic material.

The color filter layer CFL may include a second light blocking member BK2, first to third color filters CF1, CF2, and CF3, and a third passivation layer PAS3.

The second light blocking member BK2 may be disposed in the light blocking area BA on the third planarization layer OC3. The second light blocking member BK2 may overlap the first light blocking member BK1 and/or the second bank BNK2 in the thickness direction of the substrate SUB. The second light blocking member BK2 may block transmission of light. The second light blocking member BK2 may prevent light infiltration and color mixture between the first to third emission areas LA1, LA2, and LA3, which leads to the improvement of color reproducibility of the display device 10. The second light blocking member BK2 may be arranged in the form of a grid surrounding the first to third emission areas LA1, LA2, and LA3 in plan view.

The first color filter CF1 may be disposed in the first emission area LA1 on the third planarization layer OC3. The first color filter CF1 may be surrounded by the second light blocking member BK2. The first color filter CF1 may overlap the first wavelength conversion part WLC1 in the thickness direction of the substrate SUB. The first color filter CF1 may selectively allow the first color light (e.g., red light) to pass therethrough, and block or absorb the second color light (e.g., green light) and the third color light (e.g., blue light). For example, the first color filter CF1 may be a red color filter and contain a red colorant.

The second color filter CF2 may be disposed in the second emission area LA2 on the third planarization layer OC3. The second color filter CF2 may be surrounded by the second light blocking member BK2. The second color filter CF2 may overlap the second wavelength conversion part WLC2 in the thickness direction of the substrate SUB. The second color filter CF2 may selectively allow the second color light (e.g., green light) to pass therethrough, and block or absorb the first color light (e.g., red light) and the third color light (e.g., blue light). For example, the second color filter CF2 may be a green color filter and contain a green colorant.

The third color filter CF3 may be disposed in the third emission area LA3 on the third planarization layer OC3. The third color filter CF3 may be surrounded by the second light blocking member BK2. The third color filter CF3 may overlap the light transmission part LTU in the thickness direction of the substrate SUB. The third color filter CF3 may selectively allow the third color light (e.g., blue light) to pass therethrough, and block or absorb the first color light (e.g., red light) and the second color light (e.g., green light). For example, the third color filter CF3 may be a blue color filter and contain a blue colorant.

The first to third color filters CF1, CF2, and CF3 may absorb a part of the light coming from the outside of the display device 10 to reduce the reflected light of the external light. This means that the first to third color filters CF1, CF2, and CF3 can prevent or reduce color distortion caused by the reflection of the external light.

Because the first to third color filters CF1, CF2, and CF3 are directly disposed on the third planarization layer OC3 of the wavelength conversion layer WLCL, the display device 10 may not require a separate substrate for the first to third color filters CF1, CF2, and CF3. Therefore, the thickness of the display device 10 may be relatively reduced.

The third passivation layer PAS3 may cover the first to third color filters CF1, CF2, and CF3. The third passivation layer PAS3 may protect the first to third color filters CF1, CF2, and CF3.

The encapsulation layer TFE may be disposed on the third passivation layer PAS3 of the color filter layer CFL. The encapsulation layer TFE may cover the top and side surfaces of the display layer DPL containing the thin film transistor layer TFTL, the light emitting element layer EML, the wavelength conversion layer WLCL, and the color filter layer CFL. For example, the encapsulation layer TFE may include at least one inorganic film to prevent permeation of oxygen or moisture. In addition, the encapsulation layer TFE may include at least one organic film to protect the display device 10 from foreign substances such as dust.

Figure 3:
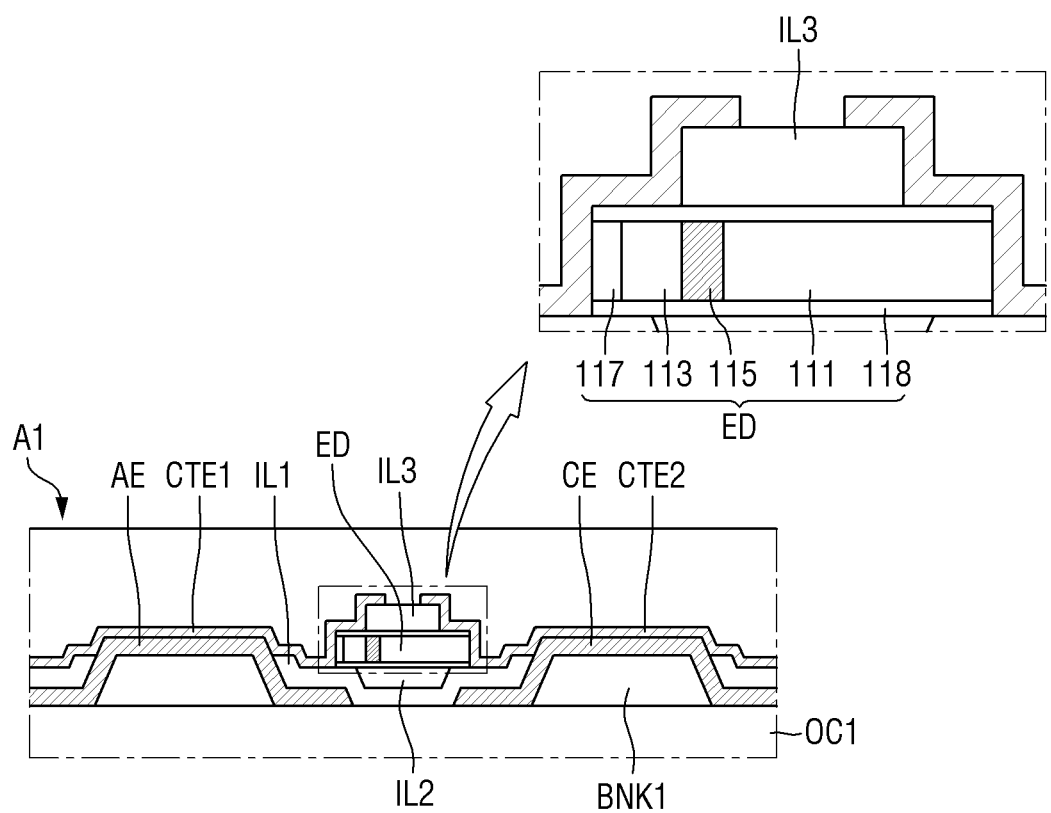
FIG. 3 is an enlarged view of an area A1 of FIG. 2.

FIG. 3 is an enlarged view of an area A1 of FIG. 2.

Referring to FIG. 3, the light emitting element layer EML of the display device 10 may be disposed on the thin film transistor layer TFTL, and may include first to third insulating layers IL1, IL2, and IL3.

The plurality of first banks BNK1 may be disposed in each of the first to third emission areas LA1, LA2, and LA3. Each of the first banks BNK1 may correspond to the first electrode AE or the second electrode CE. The plurality of first banks BNK1 may be disposed on the first planarization layer OC1, and the side surface of each of the plurality of first banks BNK1 may be inclined from the first planarization layer OC1. Each of the first and second electrodes AE and CE may be disposed on the corresponding first bank BNK1. The first bank BNK1 may include polyimide (PI), but is not limited thereto.

The first and second electrodes AE and CE may include a transparent conductive material. For example, each of the first and second electrodes AE and CE may include at least one of indium tin oxide (ITO), indium zinc oxide (IZO), or indium tin zinc oxide (ITZO), but is not limited thereto.

The first and second electrodes AE and CE may include a conductive material having high reflectivity. For example, the first and second electrodes AE and CE may include a metal such as silver (Ag), copper (Cu), or aluminum (Al) having high reflectivity. The first and second electrodes AE and CE may reflect light incident from the light emitting diode ED in an upward direction of the display device 10.

The first insulating layer IL1 may be disposed on the first planarization layer OC1, the first electrode AE, and the second electrode CE. The first insulating layer IL1 may cover a part of each of the first and second electrodes AE and CE. For example, the first insulating layer IL1 may include an opening exposing a part of the first and second electrodes AE and CE corresponding to the top surface of the first bank BNK1. The first insulating layer IL1 may protect the first and second electrodes AE and CE, and may insulate the first and second electrodes AE and CE from each other. The first insulating layer IL1 may prevent the light emitting diode ED from being damaged by direct contact with other members.

For example, the first insulating layer IL1 may include an inorganic insulating material, and may include a stepped portion recessed between the first and second electrodes AE and CE. The second insulating layer IL2 may fill the recessed stepped portion of the first insulating layer IL1. Therefore, the second insulating layer IL2 may planarize the top surface of the first insulating layer IL1, and the light emitting diode ED may be disposed on the first and second insulating layers IL1 and IL2.

The light emitting diode ED may be disposed between the first electrode AE and the second electrode CE on the first and second insulating layers IL1 and IL2. One end of the light emitting diode ED may be connected to the first electrode AE, and the other end of the light emitting diode ED may be connected to the second electrode CE. For example, the light emitting diode ED may be connected to the first electrode AE through a first contact electrode CTE1, and may be connected to the second electrode CE through a second contact electrode CTE2.

The light emitting diode ED may have a micro-meter or nano-meter size, and may be an inorganic light emitting diode including an inorganic material. The inorganic light emitting diode may be aligned between two electrodes AE and CE facing each other by an electric field formed in a specific direction between the two electrodes AE and CE.

The light emitting diode ED may include a first semiconductor layer 111, a second semiconductor layer 113, an active layer 115, an electrode layer 117, and an insulating layer 118.

The first semiconductor layer 111 may be an n-type semiconductor. For example, when the light emitting diode ED emits blue light, the first semiconductor layer 111 may include a semiconductor material having a chemical formula of $Al_xGa_yIn_{1-x-y}N$ ($0 \le x \le 1$, $0 \le y \le 1$, $0 \le x+y \le 1$). The first semiconductor layer 111 may include at least one semiconductor material of n-type doped AlGaInN, GaN, AlGaN, InGaN, AlN, or InN. The first semiconductor layer 111 may be doped with an n-type dopant such as Si, Ge, or Sn. The first semiconductor layer 111 may be n-type Si-doped n-GaN.

The second semiconductor layer 113 may be disposed on the active layer 115. For example, when the light emitting diode ED emits blue or green light, the second semiconductor layer 113 may include a semiconductor material having a chemical formula of $Al_xGa_yIn_{1-x-y}N$ ($0 \le x \le 1$, $0 \le y \le 1$, $0 \le x+y \le 1$). For example, the second semiconductor layer 113 may include at least one semiconductor material of p-type doped AlGaInN, GaN, AlGaN, InGaN, AlN, or InN. The second semiconductor layer 113 may be doped with a p-type dopant such as Mg, Zn, Ca, Se, or Ba. The second semiconductor layer 113 may be p-type Mg-doped p-GaN.

The active layer 115 may be disposed between the first and second semiconductor layers 111 and 113. The active layer 115 may include a material having a single or multiple quantum well structure. When the active layer 115 includes a material having a multiple quantum well structure, a plurality of quantum layers and well layers may be stacked alternately. The active layer 115 may emit light by coupling of electron-hole pairs according to an electrical signal applied through the first and second semiconductor layers 111 and 113. For example, when the active layer 115 emits blue light, it may include a material such as AlGaN or AlGaInN. When the active layer 115 has a multiple quantum well structure in which quantum layers and well layers are alternately stacked, the quantum layer may include a material such as AlGaN or AlGaInN, and the well layer may include a material such as GaN or AlInN. The active layer 115 may include AlGaInN as the quantum layer and AlInN as the well layer to emit blue light.

The electrode layer 117 may be an ohmic contact electrode. As another example, the electrode layer 117 may be a Schottky contact electrode. The light emitting diode ED may include at least one electrode layer 117. When the light emitting diode ED is electrically connected to the first or second contact electrode CTE1 or CTE2, the electrode layer 117 may reduce the resistance between the light emitting diode ED and the first or second contact electrode CTE1 or CTE2. The electrode layer 117 may contain a conductive metal.

The insulating layer 118 may surround the outer surfaces (e.g., outer circumferential or peripheral surfaces) of the plurality of semiconductor layers and electrode layers. The insulating layer 118 may surround the outer surface (e.g., an outer circumferential or peripheral surface) of the active layer 115, and may extend in the extending direction of the light emitting diode ED. The insulating layer 118 may protect the light emitting diode ED. For example, the insulating layer 118 may surround the side surface of the light emitting diode ED, and may expose the both ends of the light emitting diode ED in the longitudinal direction. In addition, the insulating layer 118 may surround the active layer 115 to protect the outer surface (e.g., an outer circumferential or peripheral surface) of the light emitting diode ED, thereby preventing a decrease in light emission efficiency.

The third insulating layer IL3 may be partially disposed on the light emitting diode ED disposed between the first and second electrodes AE and CE. The third insulating layer IL3 may partially cover the outer surface (e.g., an outer circumferential or peripheral surface) of the light emitting diode ED. The third insulating layer IL3 may protect the light emitting diode ED.

The first contact electrode CTE1 may cover a part (e.g., a first end portion) of the light emitting diode ED and the first electrode AE, and may electrically connect the first electrode AE to the light emitting diode ED. The second contact electrode CTE2 may cover another part (e.g., a second end portion) of the light emitting diode ED and the second electrode CE, and may electrically connect the second electrode CE to the light emitting diode ED. The first and second contact electrodes CTE1 and CTE2 may include a conductive material. For example, the first and second contact electrodes CTE1 and CTE2 may include ITO, IZO, ITZO, aluminum (Al), or the like, but are not limited thereto.

Figure 4:
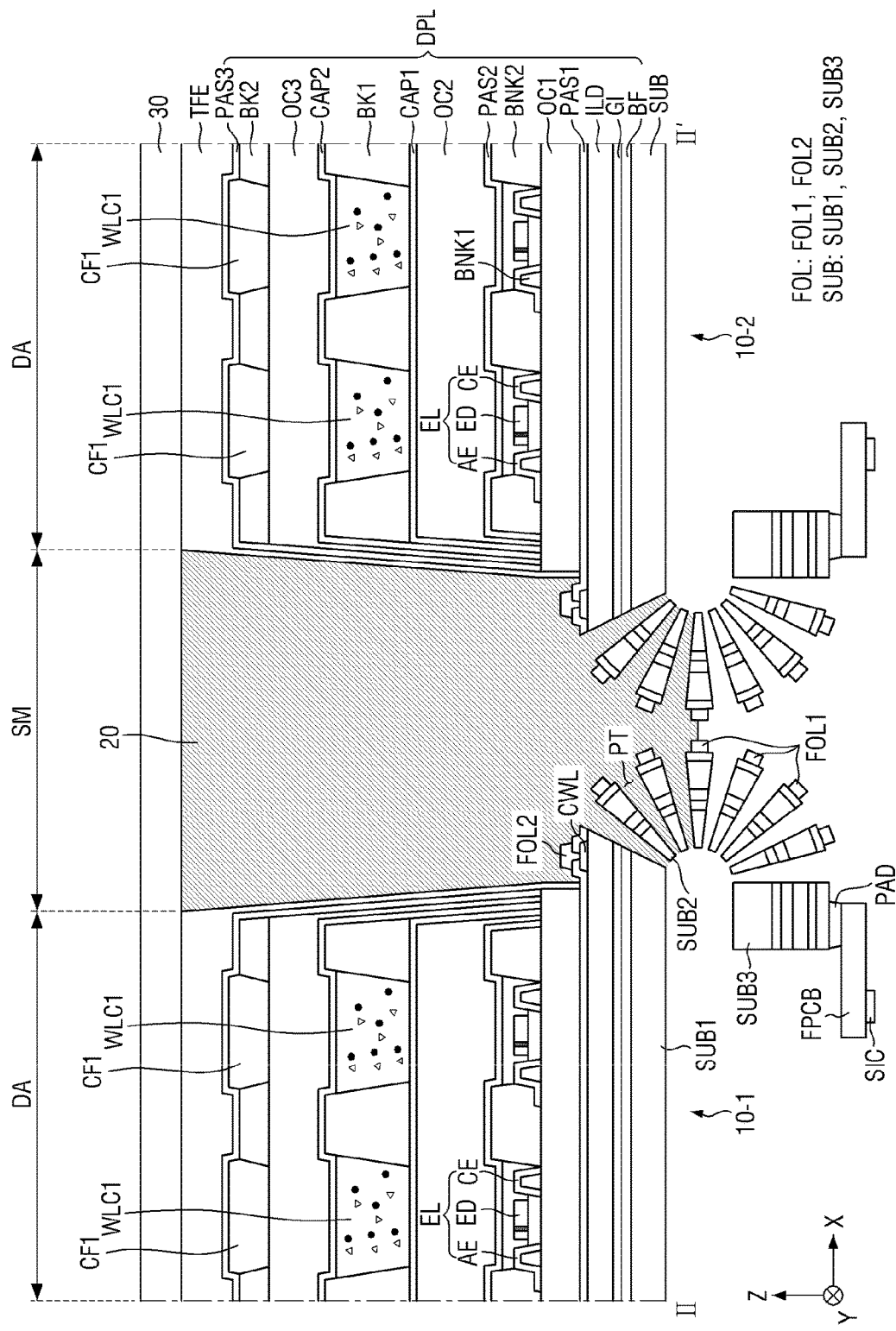
FIG. 4 is a cross-sectional view of an example, which is taken along the line II-II' of FIG. 1.
Figure 5:
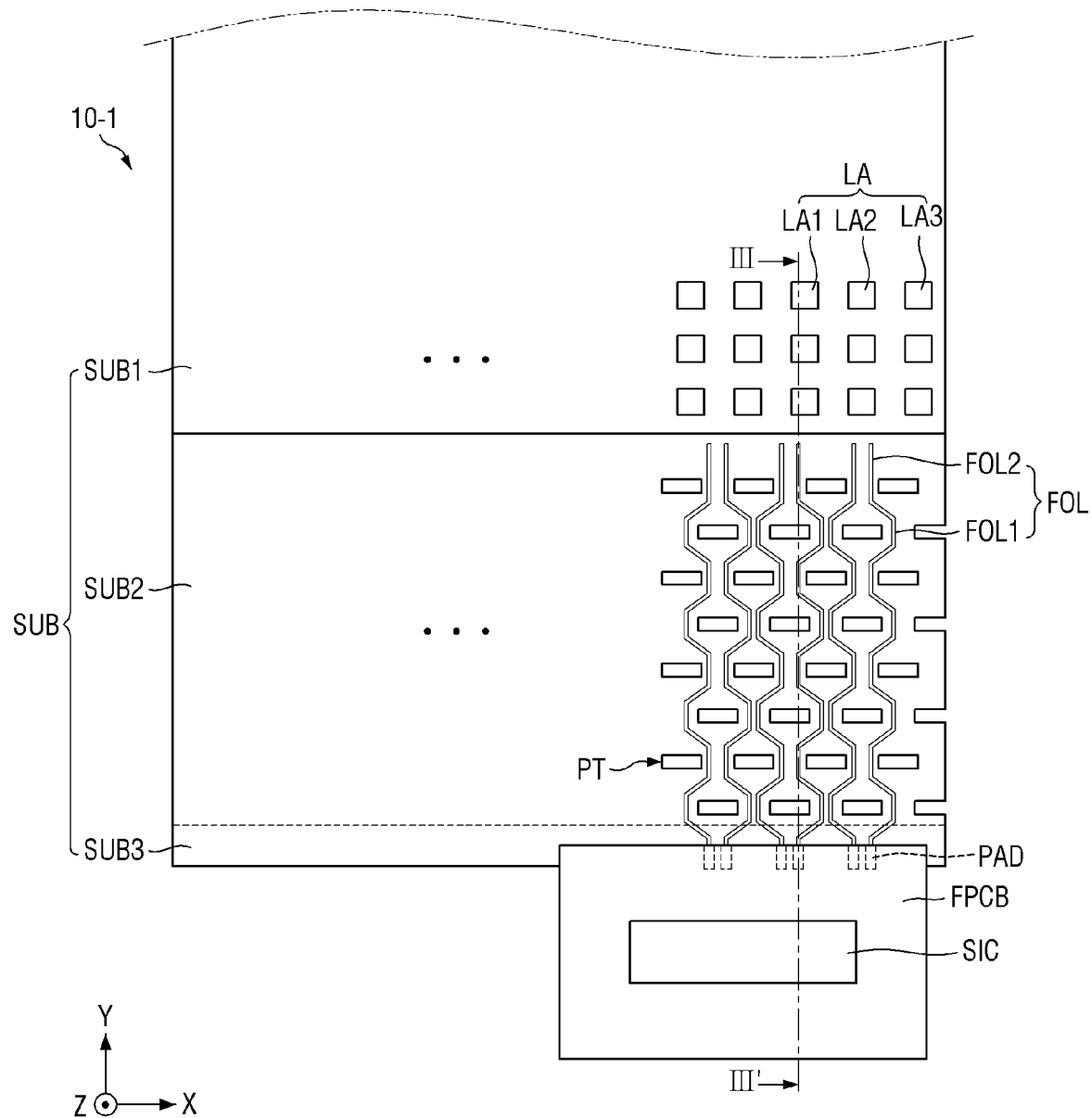
FIG. 5 is a plan view showing an example of a display device before bending, in the tiled display device of FIG. 4.
Figure 6:
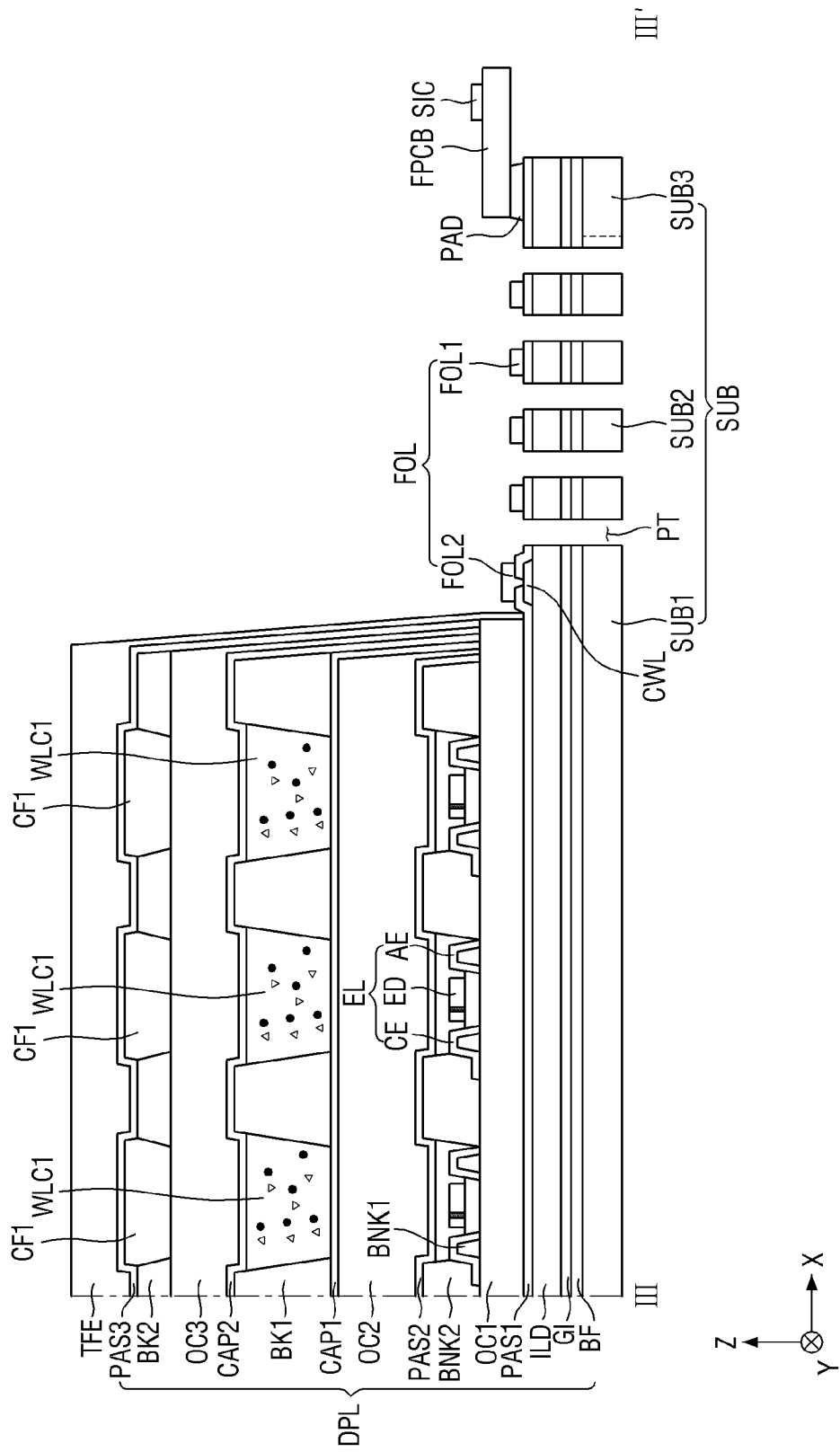
FIG. 6 is a cross-sectional view taken along the line III-III' of FIG. 5.

FIG. 4 is a cross-sectional view of an example, which is taken along the line II-II' of FIG. 1. FIG. 5 is a plan view showing an example of a display device before bending, in the tiled display device of FIG. 4. FIG. 6 is a cross-sectional view taken along the line III-III' of FIG. 5. Hereinafter, the same configurations as the above-described configurations will be briefly described, or a description thereof will be omitted.

Referring to FIGS. 4-6, the tiled display device TD may include a plurality of display devices 10, a bonding member 20, and a cover member 30. The tiled display device TD may include the first to fourth display devices 10-1, 10-2, 10-3, and 10-4, but the number of the display devices 10 is not limited to that illustrated in the embodiment of FIG. 1. The number of the display devices 10 may be determined according to the size of each of the display devices 10 and the tiled display device TD.

Each of the first and second display devices 10-1 and 10-2 may include a substrate SUB, a display layer DPL, an encapsulation layer TFE, a connection line CWL, a pad portion PAD, a fan-out line FOL, a plurality of pattern holes PT, a flexible film FPCB, and a source driver SIC.

The substrate SUB may be a base substrate or a base member, and may be made of an insulating material such as a polymer resin. The substrate SUB may be a flexible substrate that can be bent, folded and/or rolled. For example, the substrate SUB may include a glass material or a metal material, but is not limited thereto. For another example, the substrate SUB may include polyimide (PI).

The substrate SUB may include a first portion SUB1, a second portion SUB2, and a third portion SUB3.

The first portion SUB1 may correspond to the display area DA of the display device 10. The thin film transistor layer TFTL, the light emitting element layer EML, the wavelength conversion layer WLCL, the color filter layer CFL, and the encapsulation layer TFE may be sequentially stacked on the first portion SUB1. Therefore, the first portion SUB1 may support the display layer DPL of the display device 10.

The second portion SUB2 may extend from one side of the first portion SUB1. The buffer layer BF, the gate insulating layer GI, the interlayer insulating layer ILD, and the first passivation layer PAS1 may be sequentially stacked on the second portion SUB2. The second portion SUB2 may be bent after the display layer DPL is stacked on the first portion SUB1 of the substrate SUB. In FIG. 4, the second portion SUB2 of the substrate SUB may be bent along a bending axis in the first direction (X-axis direction). The second portion SUB2 may be disposed between the first portion SUB1 and the third portion SUB3. The second portion SUB2 may support the fan-out line FOL that connects the pad portion PAD disposed on the third portion SUB3 to the connection line CWL disposed on the first portion SUB1.

The second portion SUB2 may be disposed in the coupling area SM. The second portion SUB2 is bent in the coupling area SM, so that the flexible film FPCB and the source driver SIC may be bonded at the rear surface of the substrate SUB, and the width of the coupling area SM or the distance between the plurality of display devices 10 may be small enough that it is not recognized by the user. Accordingly, in the tiled display device TD, the coupling area SM may be prevented from being recognized by the user, thereby removing a sense of disconnection between the plurality of display devices 10 and improving a sense of immersion in an image.

The third portion SUB3 may be disposed at the edge of the substrate SUB. The third portion SUB3 may overlap the first portion SUB1 in the thickness direction or the Z-axis direction by the bending of the second portion SUB2. The buffer layer BF, the gate insulating layer GI, the interlayer insulating layer ILD, and the first passivation layer PAS1 may be sequentially stacked on the third portion SUB3. The third portion SUB3 may support the pad portion PAD disposed on the first passivation layer PAS1.

The connection line CWL may be disposed at the edge on the first portion SUB1 of the substrate SUB. For example, the connection line CWL may be disposed on the interlayer insulating layer ILD. In this case, the connection line CWL may be made of the same material in the same layer as the first and second connection electrodes CNE1 and CNE2. The connection line CWL may be connected to the first connection electrode CNE1 through the data line, and may supply the data voltage received from the pad portion PAD and the fan-out line FOL to the thin film transistor TFT.

For another example, the connection line CWL may be disposed on the gate insulating layer GI. In this case, the connection line CWL may be formed of the same material in the same layer as the gate electrode GE of the thin film transistor TFT. The connection line CWL may be connected to the gate electrode GE of the thin film transistor TFT through the gate line, and may supply the gate signal received from the pad portion PAD and the fan-out line FOL to the thin film transistor TFT.

The pad portion PAD may be disposed on the third portion SUB3 of the substrate SUB. The pad portion PAD may be disposed on the first passivation layer PAS1. The pad portion PAD may overlap the first portion SUB1 of the substrate SUB or the display area DA by the bending of the second portion SUB2 of the substrate SUB in the thickness direction (i.e., the Z-axis direction). The pad portion PAD may be connected between the flexible film FPCB and the fan-out line FOL. The pad portion PAD may receive a data voltage or a gate signal from the source driver SIC through the flexible film FPCB, and may supply a data voltage or a gate signal to the connection line CWL through the fan-out line FOL.

The fan-out line FOL may be disposed on the second portion SUB2 of the substrate SUB, and may be connected between the pad portion PAD and the connection line CWL. The fan-out line FOL may be bent to bypass the plurality of pattern holes PT in plan view. For example, the fan-out line FOL may connect the connection line CWL on the first portion SUB1 of the substrate SUB and the pad portion PAD on the third portion SUB3 of the substrate SUB spaced in the second direction (Y-axis direction). The width of each of the plurality of pattern holes PT in the first direction (X-axis direction) may be greater than the width thereof in the second direction (Y-axis direction). For example, each of the plurality of pattern holes PT may have a rectangular shape having long sides in the first direction (X-axis direction), but is not limited thereto. The plurality of pattern holes PT may have long sides in the first direction (X-axis direction), and an imaginary straight line between the connection line CWL and the pad portion PAD may extend in the second direction (Y-axis direction). The plurality of pattern holes PT may cross the imaginary straight line between the connection line CWL and the pad portion PAD. Therefore, the fan-out line FOL may be bent to bypass the plurality of pattern holes PT in plan view in order to connect the connection line CWL to the pad portion PAD. Here, the bent shape of the fan-out line FOL is not limited to that illustrated in FIG. 5, and may be changed appropriately according to the arrangement relationship of the plurality of pattern holes PT, the connection line CWL, and the pad portion PAD.

The fan-out line FOL may include a first portion FOL1 and a second portion FOL2. The first portion FOL1 of the fan-out line FOL may be connected to the pad portion PAD disposed on the third portion SUB3 of the substrate SUB. The first portion FOL1 of the fan-out line FOL may extend to the top portion of the first portion SUB1 of the substrate SUB by bypassing the plurality of pattern holes PT. The second portion FOL2 of the fan-out line FOL may be connected to the connection line CWL through a contact hole provided in the first passivation layer PAS1.

The plurality of pattern holes PT may penetrate the second portion SUB2 of the substrate SUB. Some of the plurality of pattern holes PT may be disposed at one edge of the second portion SUB2 of the substrate SUB, and one side of the second portion SUB2 of the substrate SUB may have a recess or depression due to the plurality of pattern holes PT. The plurality of pattern holes PT may further penetrate the buffer layer BF, the gate insulating layer GI, the interlayer insulating layer ILD, and the first passivation layer PAS1 stacked on the second portion SUB2 of the substrate SUB, thereby improving the bending strength of the second portion SUB2 of the substrate SUB.

The plurality of pattern holes PT may have the same shape and may be spaced from each other. For example, adjacent pattern holes PT in the plurality of pattern holes PT may be adjacent to each other in the first direction (X-axis direction) or in a diagonal direction between the first direction (X-axis direction) and the second direction (Y-axis direction). The width of each of the plurality of pattern holes PT in the first direction (X-axis direction) may be greater than the width thereof in the second direction (Y-axis direction). For example, each of the plurality of pattern holes PT may have a rectangular shape having long sides in the first direction (X-axis direction), but is not limited thereto. The plurality of pattern holes PT may have long sides in the first direction (X-axis direction). Because the bending axis of the second portion SUB2 of the substrate SUB and the long sides of the plurality of pattern holes PT extend in the first direction (X-axis direction), the plurality of pattern holes PT may improve ring-on-ring (ROR) strength and bending strength of the substrate SUB.

The flexible film FPCB may be disposed on the pad portion PAD. One side of the flexible film FPCB may be connected to the pad portion PAD, and the other side of the flexible film FPCB may be connected to the source circuit board. The flexible film FPCB may transmit a signal of the source driver SIC to the plurality of pixels. For example, the source driver SIC may be an integrated circuit (IC). In response to a source control signal of a timing controller, the source driver SIC may convert digital video data into an analog data voltage, and may supply it to a data line of the display area DA through the flexible film FPCB.

In some embodiments, the flexible film FPCB may be attached to the pad portion PAD through a connection film, but is not limited thereto. For example, the connection film may include an anisotropic conductive film. If the connection film includes an anisotropic conductive film, the connection film may have conductivity in the area where the pad portion PAD and the flexible film FPCB are in contact, and may electrically connect the flexible film FPCB to the pad portion PAD.

The bonding member 20 may be disposed between the plurality of display devices 10 to bond the side surfaces of the adjacent display devices 10 to each other. The bonding member 20 may connect the side surfaces of the first to fourth display devices 10-1 to 10-4 arranged in a grid form to implement the tiled display device TD. The bonding member 20 may bond the side surfaces of the substrate SUB and the encapsulation layer TFE of each of the display devices 10 adjacent to each other. In FIG. 4, the bonding member 20 may bond the side surfaces of the encapsulation layers TFE of the first and second display devices 10-1 and 10-2 and the second portion SUB2 of the substrate SUB.

For example, the bonding member 20 may be made of an adhesive or a double-sided tape having a relatively thin thickness to reduce or minimize the gap between the plurality of display devices 10. For another example, the bonding member 20 may be formed of a bonding frame having a relatively thin thickness to reduce or minimize the width of the coupling area SM or the gap between the plurality of display devices 10. Accordingly, in the tiled display device TD, the coupling area SM between the plurality of display devices 10 may be prevented from being recognized by the user, thereby removing or reducing a sense of disconnection between the plurality of display devices 10 and improving a sense of immersion in an image.

The cover member 30 may be disposed on the top surfaces of the plurality of display devices 10 and the bonding member 20 to cover the plurality of display devices 10 and the bonding member 20. For example, the cover member 30 may be disposed on the top surface of the encapsulation layer TFE of each of the plurality of display devices 10. The cover member 30 may protect the top surface of the tiled display device TD.

Figure 7:
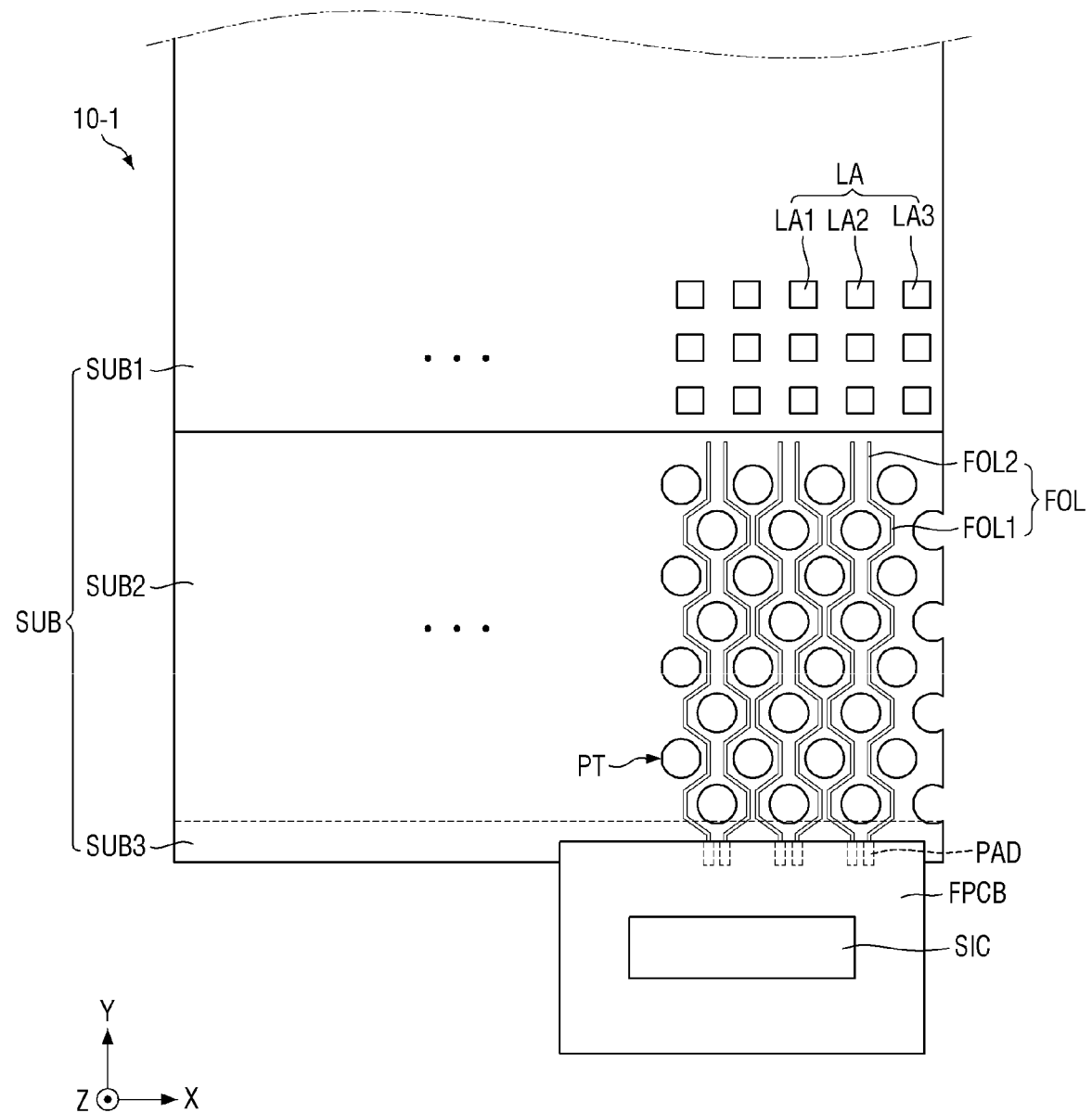
FIG. 7 is a plan view of an example showing a display device before bending in the tiled display device of FIG. 4.

FIG. 7 is a plan view of an example showing a display device before bending in the tiled display device of FIG. 4. The display device of FIG. 7 is different from the display device of FIG. 5 in the shape of the plurality of pattern holes PT, and the same configurations as those described above will be described briefly, or a description thereof will be omitted.

Referring to FIG. 7, the plurality of pattern holes PT may penetrate the second portion SUB2 of the substrate SUB. Some of the plurality of pattern holes PT may be disposed at one edge of the second portion SUB2 of the substrate SUB, and one side of the second portion SUB2 of the substrate SUB may have a recess or depression due to the plurality of pattern holes PT. The plurality of pattern holes PT may further penetrate the buffer layer BF, the gate insulating layer GI, the interlayer insulating layer ILD, and the first passivation layer PAS1 stacked on the second portion SUB2 of the substrate SUB, thereby improving the bending strength of the second portion SUB2 of the substrate SUB.

The plurality of pattern holes PT may have the same shape and may be spaced apart from each other. For example, adjacent pattern holes PT in the plurality of pattern holes PT may be adjacent to each other in the first direction (X-axis direction) or in a diagonal direction between the first direction (X-axis direction) and the second direction (Y-axis direction). For example, each of the plurality of pattern holes PT may have a circular shape, but is not limited thereto. The plurality of pattern holes PT may be arranged along a diagonal direction between the first direction (X-axis direction) and the second direction (Y-axis direction), or may be arranged along a diagonal direction between the opposite direction of the first direction (X-axis direction) and the second direction (Y-axis direction). The plurality of pattern holes PT may penetrate the second portion SUB2 of the substrate SUB, thereby improving ring-on-ring (ROR) strength and bending strength of the substrate SUB.

The fan-out line FOL may be disposed on the second portion SUB2 of the substrate SUB, and may be connected between the pad portion PAD and the connection line CWL. The fan-out line FOL may be bent to bypass the plurality of pattern holes PT in plan view. For example, the fan-out line FOL may connect the connection line CWL on the first portion SUB1 of the substrate SUB and the pad portion PAD on the third portion SUB3 of the substrate SUB spaced in the second direction (Y-axis direction). The imaginary straight line between the connecting wiring CWL and the pad portion PAD may overlap the plurality of pattern holes PT. Therefore, the fan-out line FOL may be bent to bypass the plurality of pattern holes PT in plan view in order to connect the connection line CWL to the pad portion PAD. Here, the bent shape of the fan-out line FOL is not limited to that illustrated in FIG. 7, and may be changed appropriately according to the arrangement relationship of the plurality of pattern holes PT, the connection line CWL, and the pad portion PAD.

Figure 8:
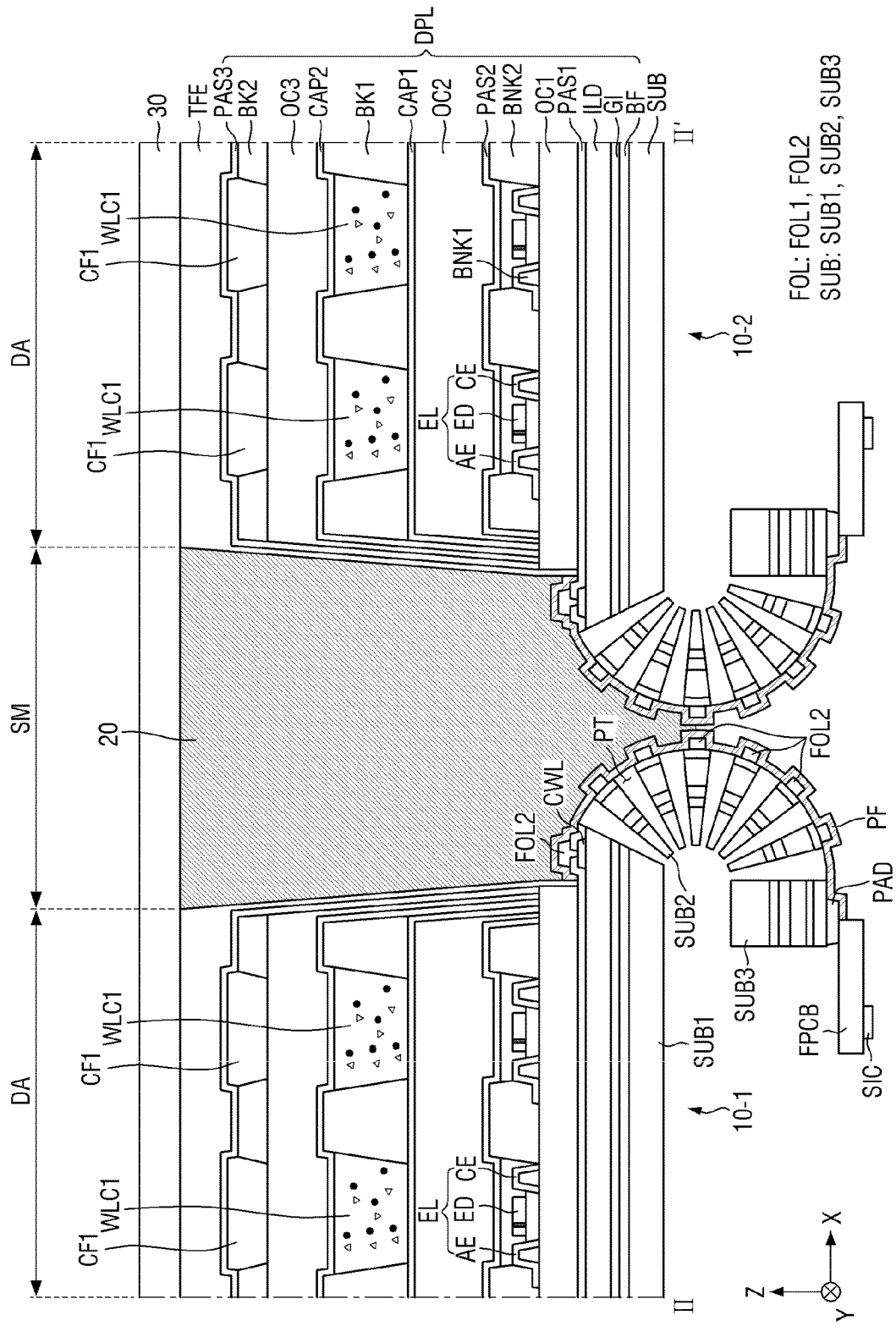
FIG. 8 is a cross-sectional view of an example taken along the line II-II' of FIG. 1.
Figure 9:
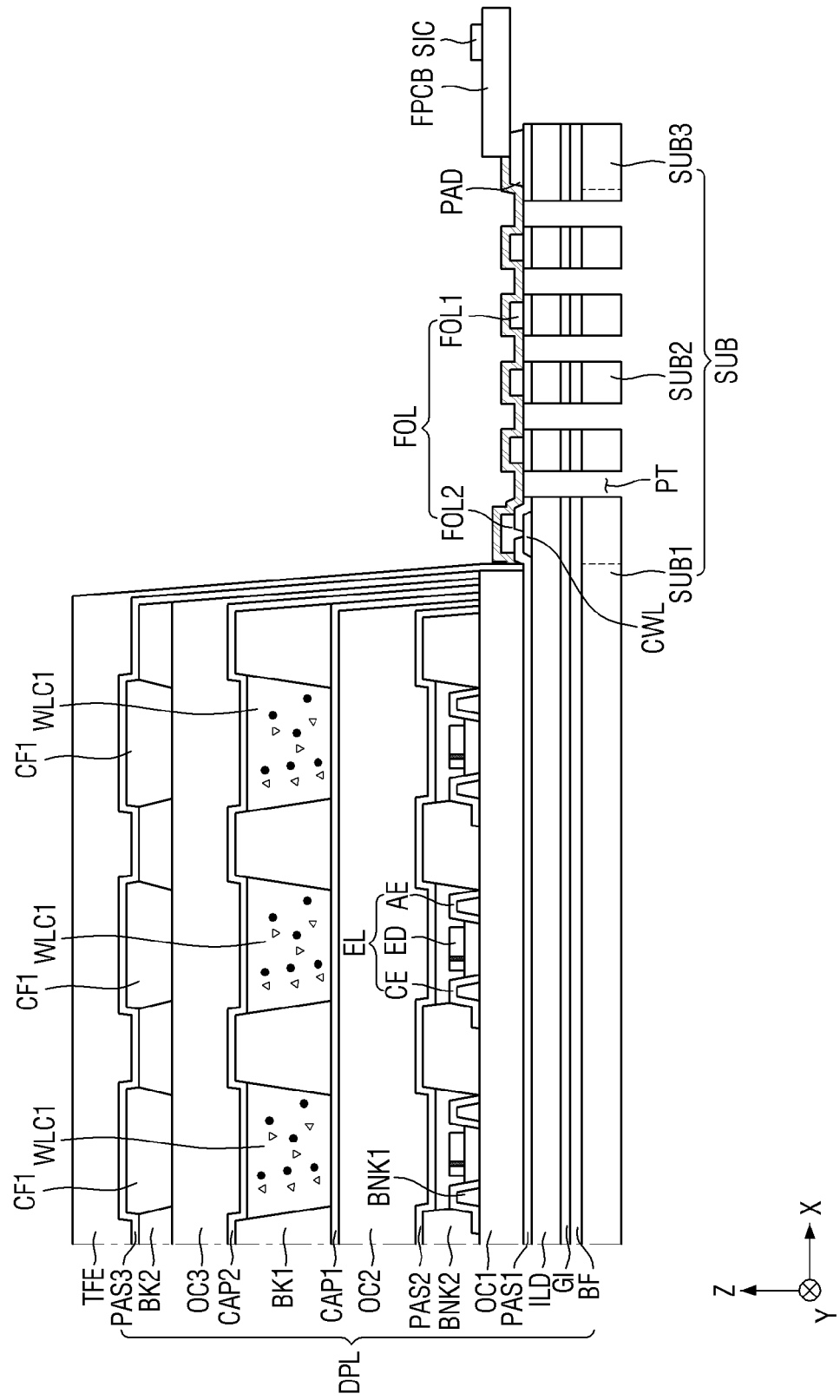
FIG. 9 is a cross-sectional view showing a display device before bending in the tiled display device of FIG. 8.

FIG. 8 is a cross-sectional view of another example taken along the line II-II' of FIG. 1, and FIG. 9 is a cross-sectional view showing a display device before bending in the tiled display device of FIG. 8. The tiled display device of FIGS. 8 and 9 further includes a protective film PF in the tiled display device of FIGS. 4 and 6, and the same configurations as those described above will be described briefly, or a description thereof will be omitted.

Referring to FIGS. 8 and 9, each of the first and second display devices 10-1 and 10-2 may include the substrate SUB, the display layer DPL, the encapsulation layer TFE, the connection line CWL, the pad portion PAD, the fan-out line FOL, the plurality of pattern holes PT, the flexible film FPCB, and the source driver SIC. Each of the first and second display devices 10-1 and 10-2 may further include the protective film PF covering the fan-out line FOL.

The fan-out line FOL may be disposed on the second portion SUB2 of the substrate SUB, and may be connected between the pad portion PAD and the connection line CWL. The fan-out line FOL may be bent to bypass the plurality of pattern holes PT in plan view. For example, the fan-out line FOL may connect the connection line CWL on the first portion SUB1 of the substrate SUB and the pad portion PAD on the third portion SUB3 of the substrate SUB spaced in the second direction (Y-axis direction). The fan-out line FOL may be bent to bypass the plurality of pattern holes PT in plan view in order to connect the connection line CWL to the pad portion PAD.

The fan-out line FOL may include a first portion FOL1 and a second portion FOL2. The first portion FOL1 of the fan-out line FOL may be connected to the pad portion PAD disposed on the third portion SUB3 of the substrate SUB. The first portion FOL1 of the fan-out line FOL may extend to the top portion of the first portion SUB1 of the substrate SUB by bypassing the plurality of pattern holes PT. The second portion FOL2 of the fan-out line FOL may be connected to the connection line CWL through a contact hole provided in the first passivation layer PAS1.

The protective film PF may cover the fan-out line FOL and protect the fan-out line FOL. For example, the protective film PF may be disposed along the fan-out line FOL on the first passivation layer PAS1 corresponding to the second portion SUB2 of the substrate SUB, and may not cover the plurality of pattern holes PT. For another example, the protective film PF may entirely cover first passivation layer PAS1 corresponding to the second portion SUB2 of the substrate SUB, the plurality of pattern holes PT, and the fan-out line FOL.

The second portion SUB2 of the substrate SUB of each of the first and second display devices 10-1 and 10-2 may be bent, and the protective film PF may cover the fan-out line FOL disposed on the second portion SUB2 of the bent substrate SUB. Therefore, the protective films PF of the first and second display devices 10-1 and 10-2 may face each other. For example, the protective films PF of the first and second display devices 10-1 and 10-2 may be fixed to each other by the bonding member 20. For another example, the protective film PF of the first display device 10-1 may be attached directly to the protective film PF of the second display device 10-2.

Figure 10:
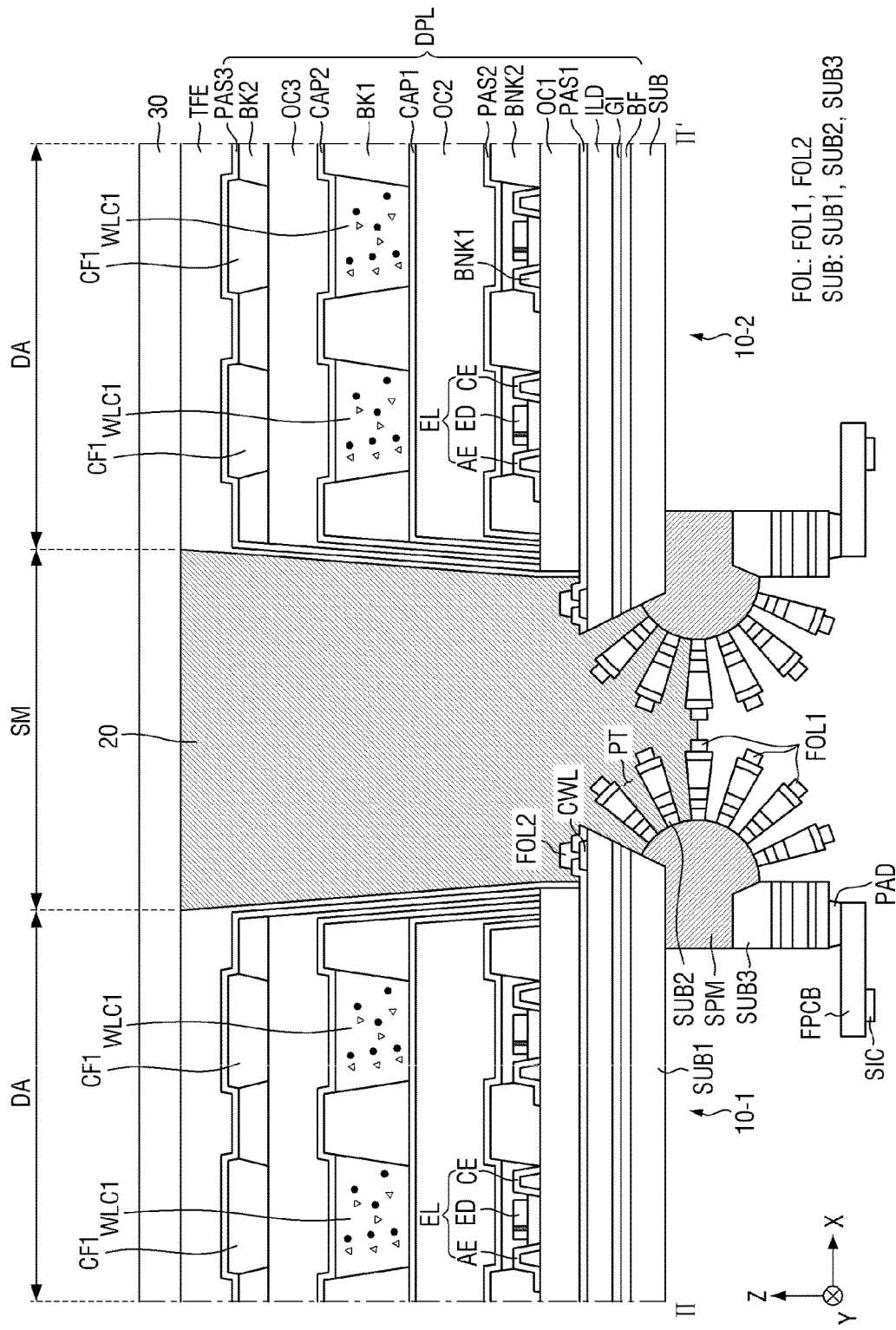
FIG. 10 is a cross-sectional view of an example taken along the line II-II' of FIG. 1.
Figure 11:
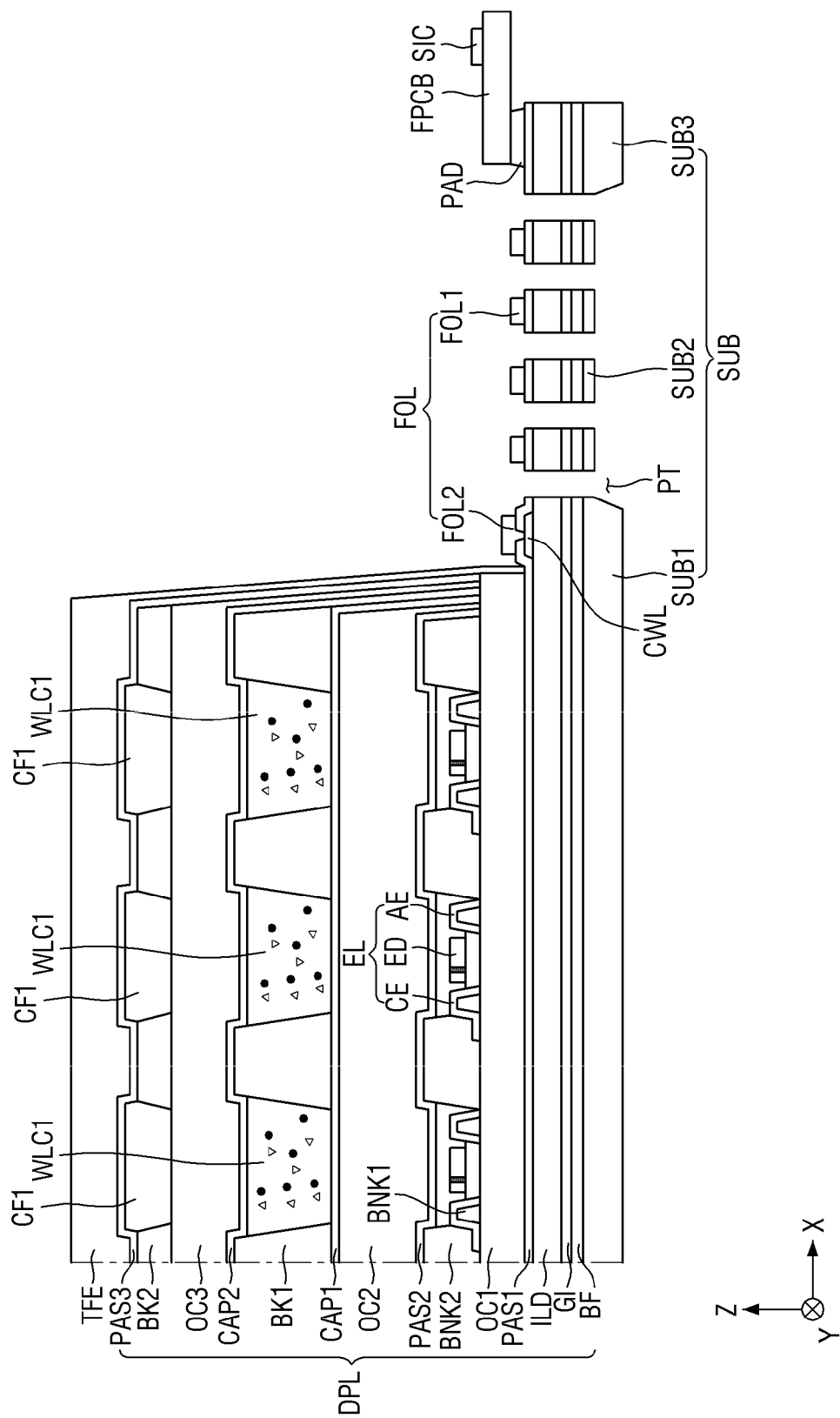
FIG. 11 is a cross-sectional view showing a display device before bending in the tiled display device of FIG. 10.

FIG. 10 is a cross-sectional view of an example taken along the line II-II' of FIG. 1, and FIG. 11 is a cross-sectional view showing a display device before bending in the tiled display device of FIG. 10. The tiled display device of FIGS. 10 and 11 is different from the tiled display device of FIGS. 4 and 6 in the configuration of the second portion SUB2 of the substrate SUB, and the same configurations as those described above will be described briefly, or a description thereof will be omitted.

Referring to FIGS. 10 and 11, each of the first and second display devices 10-1 and 10-2 may include the substrate SUB, the display layer DPL, the encapsulation layer TFE, the connection line CWL, the pad portion PAD, the fan-out line FOL, the plurality of pattern holes PT, the flexible film FPCB, and the source driver SIC. Each of the first and second display devices 10-1 and 10-2 may further include a support part SPM configured to support the second portion SUB2 of the substrate SUB.

The substrate SUB may be a base substrate or a base member, and may be made of an insulating material such as a polymer resin. The substrate SUB may be a flexible substrate that can be bent, folded and/or rolled. For example, the substrate SUB may include a glass material or a metal material, but is not limited thereto. For another example, the substrate SUB may include polyimide (PI).

The substrate SUB may include a first portion SUB1, a second portion SUB2, and a third portion SUB3.

The first portion SUB1 may correspond to the display area DA of the display device 10. The thin film transistor layer TFTL, the light emitting element layer EML, the wavelength conversion layer WLCL, the color filter layer CFL, and the encapsulation layer TFE may be sequentially stacked on the first portion SUB1. Therefore, the first portion SUB1 may support the display layer DPL of the display device 10.

The second portion SUB2 may extend from one side of the first portion SUB1. The buffer layer BF, the gate insulating layer GI, the interlayer insulating layer ILD, and the first passivation layer PAS1 may be sequentially stacked on the second portion SUB2. The second portion SUB2 may be bent after the display layer DPL is stacked on the first portion SUB1 of the substrate SUB. In FIG. 10, the second portion SUB2 of the substrate SUB may be bent along the bending axis in the first direction (X-axis direction). The second portion SUB2 may be disposed between the first portion SUB1 and the third portion SUB3. The second portion SUB2 may support the fan-out line FOL that connects the pad portion PAD disposed on the third portion SUB3 to the connection line CWL disposed on the first portion SUB1.

The thickness of the second portion SUB2 may be smaller than the thickness of the first portion SUB1 or the thickness of the third portion SUB3. The lower end of the second portion SUB2 may be depressed from the lower end of the first portion SUB1 or the lower end of the third portion SUB3. The lower end of the second portion SUB2 may have a stepped portion with respect to the lower end of the first portion SUB1 or the lower end of the third portion SUB3. The display device 10 may include the second portion SUB2 having a thickness smaller than the first portion SUB1 or the third portion SUB3, thereby reducing the bending stress of the second portion SUB2. Further, because the display device 10 includes the second portion SUB2, which is depressed from the first portion SUB1 or the third portion SUB3, by reducing the distance between the plurality of display devices 10, it is possible to prevent a non-display area or a boundary portion between the plurality of display devices 10 from being recognized.

The second portion SUB2 may be disposed in the coupling area SM. The second portion SUB2 is bent in the coupling area SM, so that the flexible film FPCB and the source driver SIC may be bonded at the rear surface of the substrate SUB, and the width of the coupling area SM or the distance between the plurality of display devices 10 may be small enough that it is not recognized by the user. Accordingly, in the tiled display device TD, the coupling area SM may be prevented from being recognized by the user, thereby removing a sense of disconnection between the plurality of display devices 10 and improving a sense of immersion in an image.

The third portion SUB3 may be disposed at the edge of the substrate SUB. The third portion SUB3 may overlap the first portion SUB1 in the thickness direction or the Z-axis direction by the bending of the second portion SUB2. The buffer layer BF, the gate insulating layer GI, the interlayer insulating layer ILD, and the first passivation layer PAS1 may be sequentially stacked on the third portion SUB3. The third portion SUB3 may support the pad portion PAD disposed on the first passivation layer PAS1.

The support part SPM may be filled in a space formed by the bending of the second portion SUB2 of the substrate SUB. The support part SPM may support the second portion SUB2 of the substrate SUB, and attach one surface of the third portion SUB3 of the substrate SUB to one surface of the first portion SUB1 of the substrate SUB. For example, the support part SPM may contain at least one organic material of an epoxy resin, an acrylic resin, a cardo resin, or an imide resin, but is not limited thereto.

Figure 12:
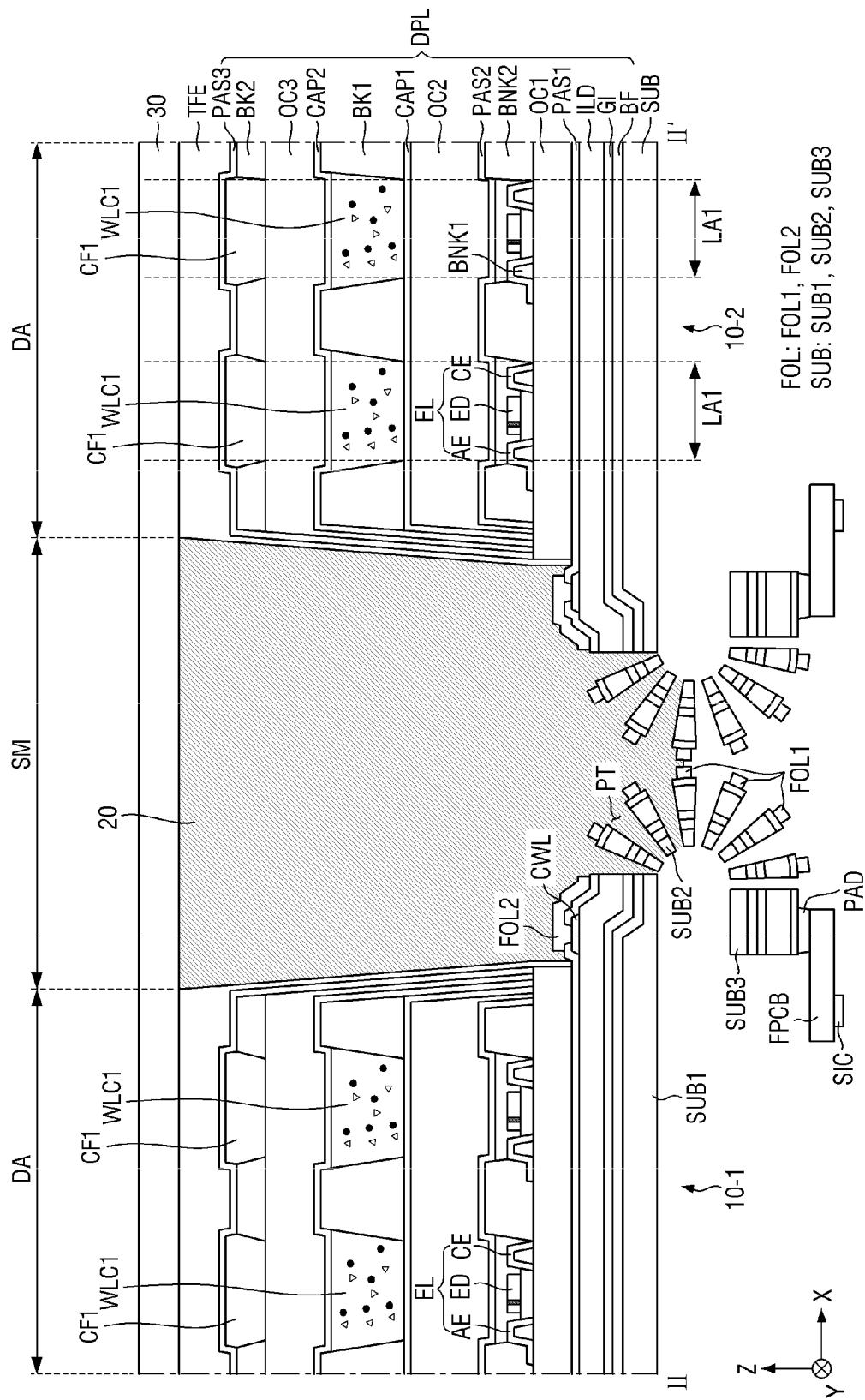
FIG. 12 is a cross-sectional view of an example taken along the line II-II' of FIG. 1.
Figure 13:
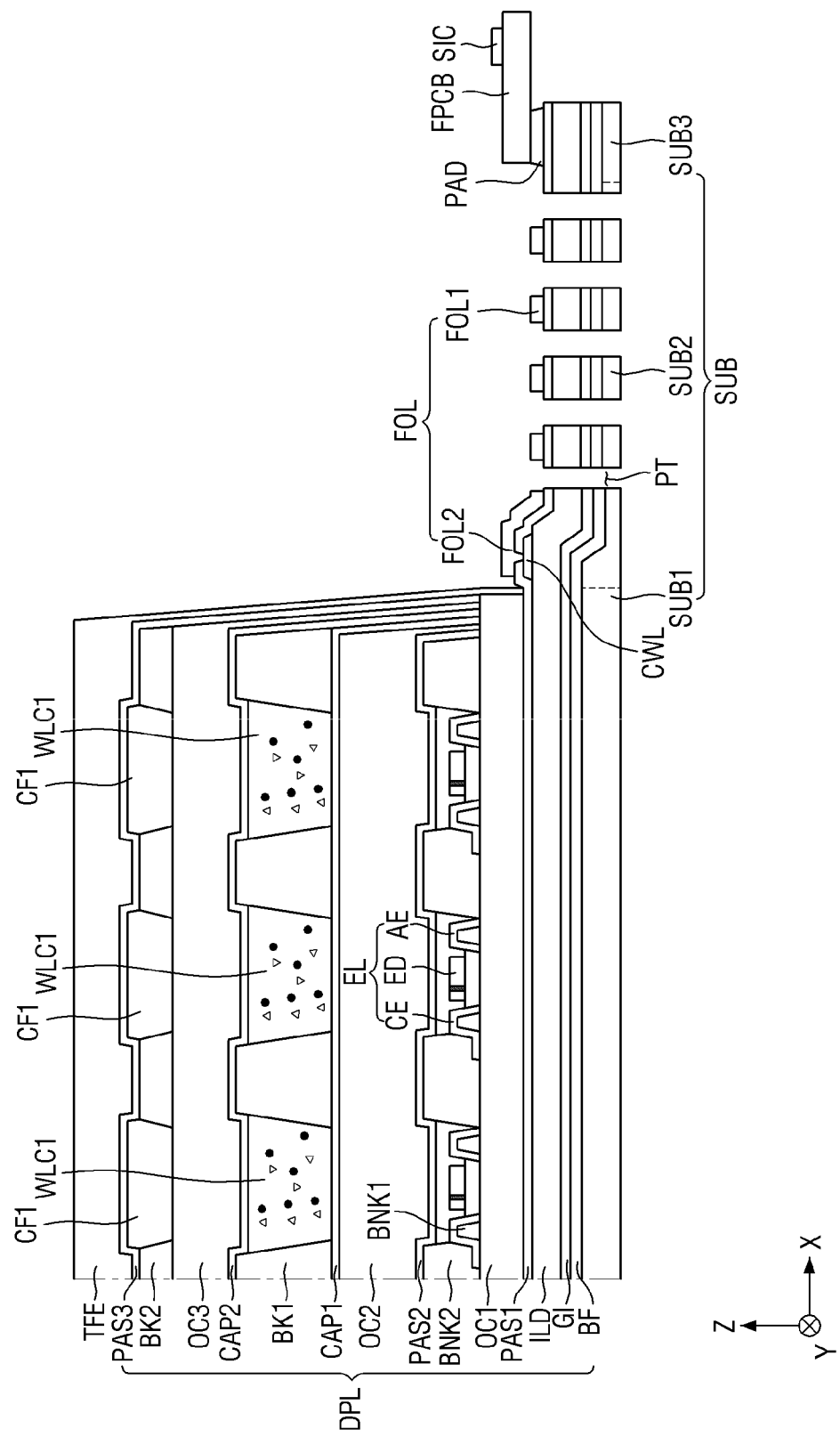
FIG. 13 is a cross-sectional view showing a display device before bending in the tiled display device of FIG. 12.

FIG. 12 is a cross-sectional view of an example taken along the line II-II' of FIG. 1, and FIG. 13 is a cross-sectional view showing a display device before bending in the tiled display device of FIG. 12. The tiled display device of FIGS. 12 and 13 is different from the tiled display device of FIGS. 10 and 11 in the configuration of the second portion SUB2 of the substrate SUB, and the same configurations as those described above will be described briefly, or a description thereof will be omitted.

Referring to FIGS. 12 and 13, each of the first and second display devices 10-1 and 10-2 may include the substrate SUB, the display layer DPL, the encapsulation layer TFE, the connection line CWL, the pad portion PAD, the fan-out line FOL, the plurality of pattern holes PT, the flexible film FPCB, and the source driver SIC.

The substrate SUB may be a base substrate or a base member, and may be made of an insulating material such as a polymer resin. The substrate SUB may be a flexible substrate that can be bent, folded and/or rolled. For example, the substrate SUB may include a glass material or a metal material, but is not limited thereto. For another example, the substrate SUB may include polyimide (PI).

The substrate SUB may include a first portion SUB1, a second portion SUB2, and a third portion SUB3.

The first portion SUB1 may correspond to the display area DA of the display device 10. The thin film transistor layer TFTL, the light emitting element layer EML, the wavelength conversion layer WLCL, the color filter layer CFL, and the encapsulation layer TFE may be sequentially stacked on the first portion SUB1. Therefore, the first portion SUB1 may support the display layer DPL of the display device 10.

The second portion SUB2 may extend from one side of the first portion SUB1. The buffer layer BF, the gate insulating layer GI, the interlayer insulating layer ILD, and the first passivation layer PAS1 may be sequentially stacked on the second portion SUB2. The second portion SUB2 may be bent after the display layer DPL is stacked on the first portion SUB1 of the substrate SUB. In FIG. 12, the second portion SUB2 of the substrate SUB may be bent along the bending axis in the first direction (X-axis direction). The second portion SUB2 may be disposed between the first portion SUB1 and the third portion SUB3. The second portion SUB2 may support the fan-out line FOL that connects the pad portion PAD disposed on the third portion SUB3 to the connection line CWL disposed on the first portion SUB1.

The thickness of the second portion SUB2 may be smaller than the thickness of the first portion SUB1. The upper end of the second portion SUB2 may be depressed from the upper end of the first portion SUB1. The upper end of the second portion SUB2 may have a stepped portion with respect to the upper end of the first portion SUB1. The display device 10 may include the second portion SUB2 having a thickness smaller than the first portion SUB1, thereby reducing the bending stress of the second portion SUB2. Further, because the display device 10 includes the second portion SUB2, which is depressed from the first portion SUB1, by reducing the distance between the plurality of display devices 10, it is possible to prevent a non-display area or a boundary portion between the plurality of display devices 10 from being recognized.

The second portion SUB2 may be disposed in the coupling area SM. The second portion SUB2 is bent in the coupling area SM, so that the flexible film FPCB and the source driver SIC may be bonded at the rear surface of the substrate SUB, and the width of the coupling area SM or the distance between the plurality of display devices 10 may be small enough that it is not recognized by the user. Accordingly, in the tiled display device TD, the coupling area SM may be prevented from being recognized by the user, thereby removing a sense of disconnection between the plurality of display devices 10 and improving a sense of immersion in an image.

The third portion SUB3 may be disposed at the edge of the substrate SUB. The third portion SUB3 may overlap the first portion SUB1 in the thickness direction or the Z-axis direction by the bending of the second portion SUB2. The buffer layer BF, the gate insulating layer GI, the interlayer insulating layer ILD, and the first passivation layer PAS1 may be sequentially stacked on the third portion SUB3. The third portion SUB3 may support the pad portion PAD disposed on the first passivation layer PAS1.

Figure 14:
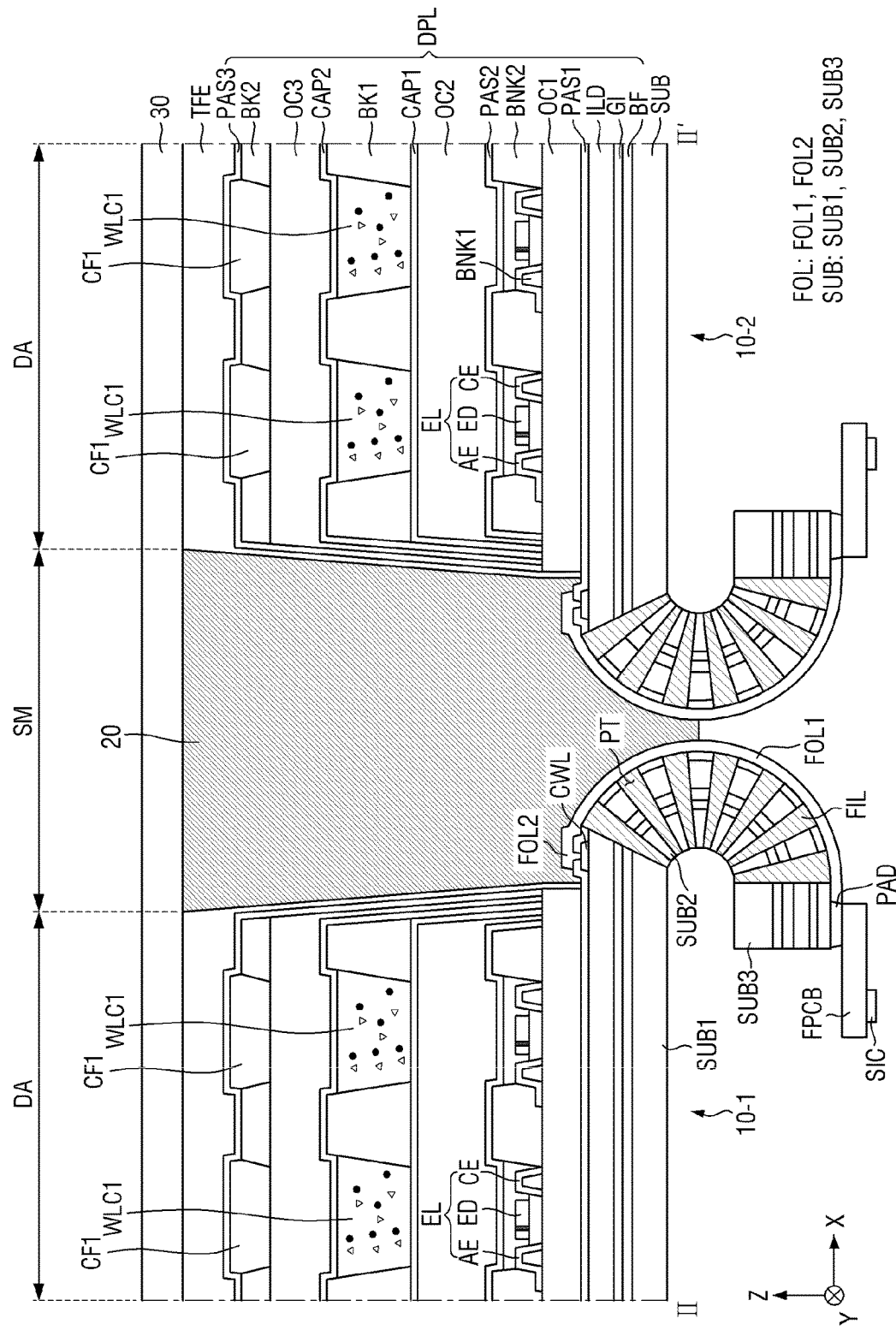
FIG. 14 is a cross-sectional view of an example taken along the line II-II' of FIG. 1.
Figure 15:
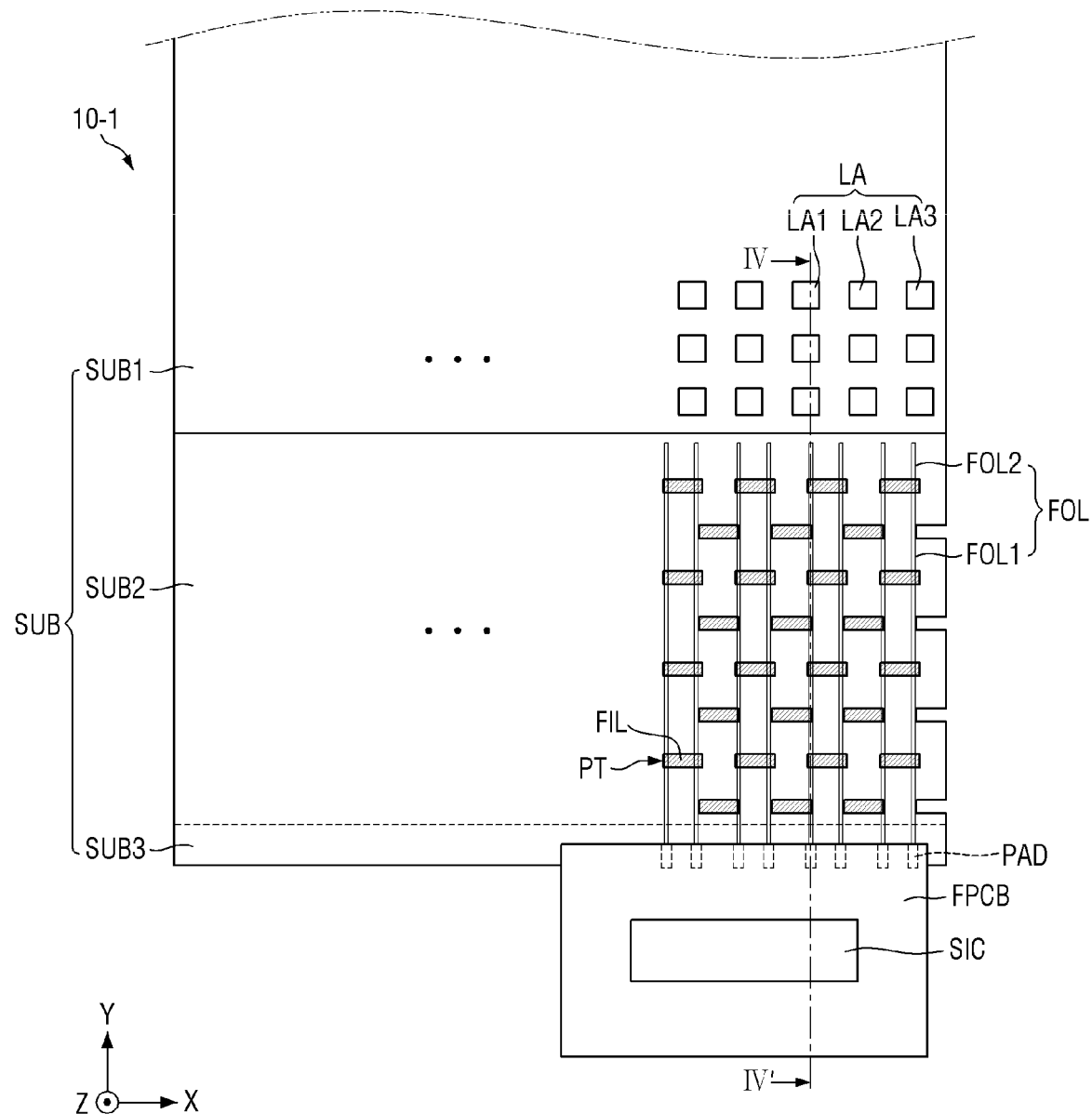
FIG. 15 is a plan view showing a display device before bending, in the tiled display device of FIG. 14.
Figure 16:
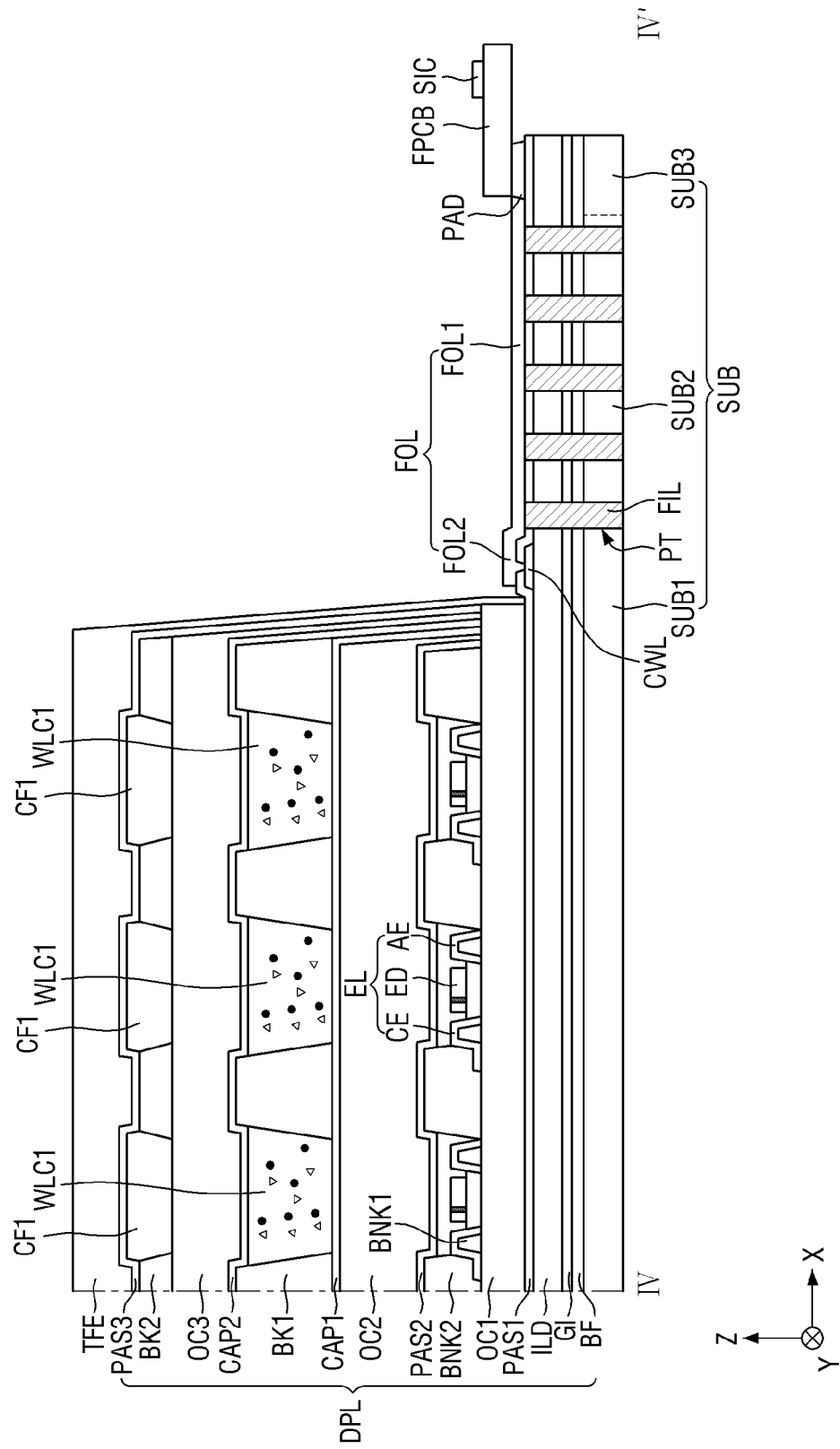
FIG. 16 is a cross-sectional view taken along the line IV-IV' of FIG. 15.

FIG. 14 is a cross-sectional view of an example taken along the line II-II' of FIG. 1. FIG. 15 is a plan view showing a display device before bending, in the tiled display device of FIG. 14. FIG. 16 is a cross-sectional view taken along the line IV-IV' of FIG. 15. The tiled display device of FIGS. 14-16 is different from the tiled display device of FIGS. 4 and 6 in the configuration of the fan-out line FOL by further including a filling part FIL, and the same configurations as those described above will be described briefly, or a description thereof will be omitted.

Referring to FIGS. 14-16, each of the first and second display devices 10-1 and 10-2 may include the substrate SUB, the display layer DPL, the encapsulation layer TFE, the connection line CWL, the pad portion PAD, the fan-out line FOL, the plurality of pattern holes PT, the flexible film FPCB, and the source driver SIC. Each of the first and second display devices 10-1 and 10-2 may further include the filling part FIL inserted into the plurality of pattern holes PT.

The plurality of pattern holes PT may penetrate the second portion SUB2 of the substrate SUB. Some of the plurality of pattern holes PT may be disposed at one edge of the second portion SUB2 of the substrate SUB, and one side of the second portion SUB2 of the substrate SUB may have a recess or depression due to the plurality of pattern holes PT. The plurality of pattern holes PT may further penetrate the buffer layer BF, the gate insulating layer GI, the interlayer insulating layer ILD, and the first passivation layer PAS1 stacked on the second portion SUB2 of the substrate SUB, thereby improving the bending strength of the second portion SUB2 of the substrate SUB.

The plurality of pattern holes PT may have the same shape and may be spaced from each other. For example, adjacent pattern holes PT in the plurality of pattern holes PT may be adjacent to each other in the first direction (X-axis direction) or in a diagonal direction between the first direction (X-axis direction) and the second direction (Y-axis direction). The width of each of the plurality of pattern holes PT in the first direction (X-axis direction) may be greater than the width thereof in the second direction (Y-axis direction). For example, each of the plurality of pattern holes PT may have a rectangular shape having long sides in the first direction (X-axis direction), but is not limited thereto. The plurality of pattern holes PT may have long sides in the first direction (X-axis direction). Because the bending axis of the second portion SUB2 of the substrate SUB and the long sides of the plurality of pattern holes PT extend in the first direction (X-axis direction), the plurality of pattern holes PT may improve ring-on-ring (ROR) strength and bending strength of the substrate SUB.

The filling part FIL may be inserted into the plurality of pattern holes PT. The filling part FIL is inserted into the plurality of pattern holes PT, thereby improving ring-on-ring (ROR) strength and bending strength of the substrate SUB, so that the plurality of pattern holes PT can be stably supported. For example, the filling part FIL may contain at least one organic material of an epoxy resin, an acrylic resin, a cardo resin, or an imide resin, but is not limited thereto. For example, the filling part FIL may not be inserted into the plurality of pattern holes PT disposed at one edge of the second portion SUB2 of the substrate SUB, but is not limited thereto.

The fan-out line FOL may be disposed on the second portion SUB2 of the substrate SUB, and may be connected between the pad portion PAD and the connection line CWL. The fan-out line FOL may extend on the top surface of the filling part FIL inserted into the plurality of pattern holes PT. For example, the fan-out line FOL may connect the connection line CWL on the first portion SUB1 of the substrate SUB and the pad portion PAD on the third portion SUB3 of the substrate SUB spaced in the second direction (Y-axis direction). The plurality of pattern holes PT may cross the imaginary straight line between the connection line CWL and the pad portion PAD. Because the filling part FIL is inserted into the plurality of pattern holes PT, it may support the fan-out line FOL running on the plurality of pattern holes PT. Thus, the fan-out line FOL may extend along the plurality of pattern holes PT by the fill member FIL to connect the connecting wiring CWL to the pad portion PAD. The fan-out line FOL may have a linear shape in plan view, but the shape of the fan-out line FOL is not limited to that illustrated in FIG. 15, and it may be bent if necessary according to the arrangement relationship between the connection line CWL and the pad portion PAD.

Figure 17:
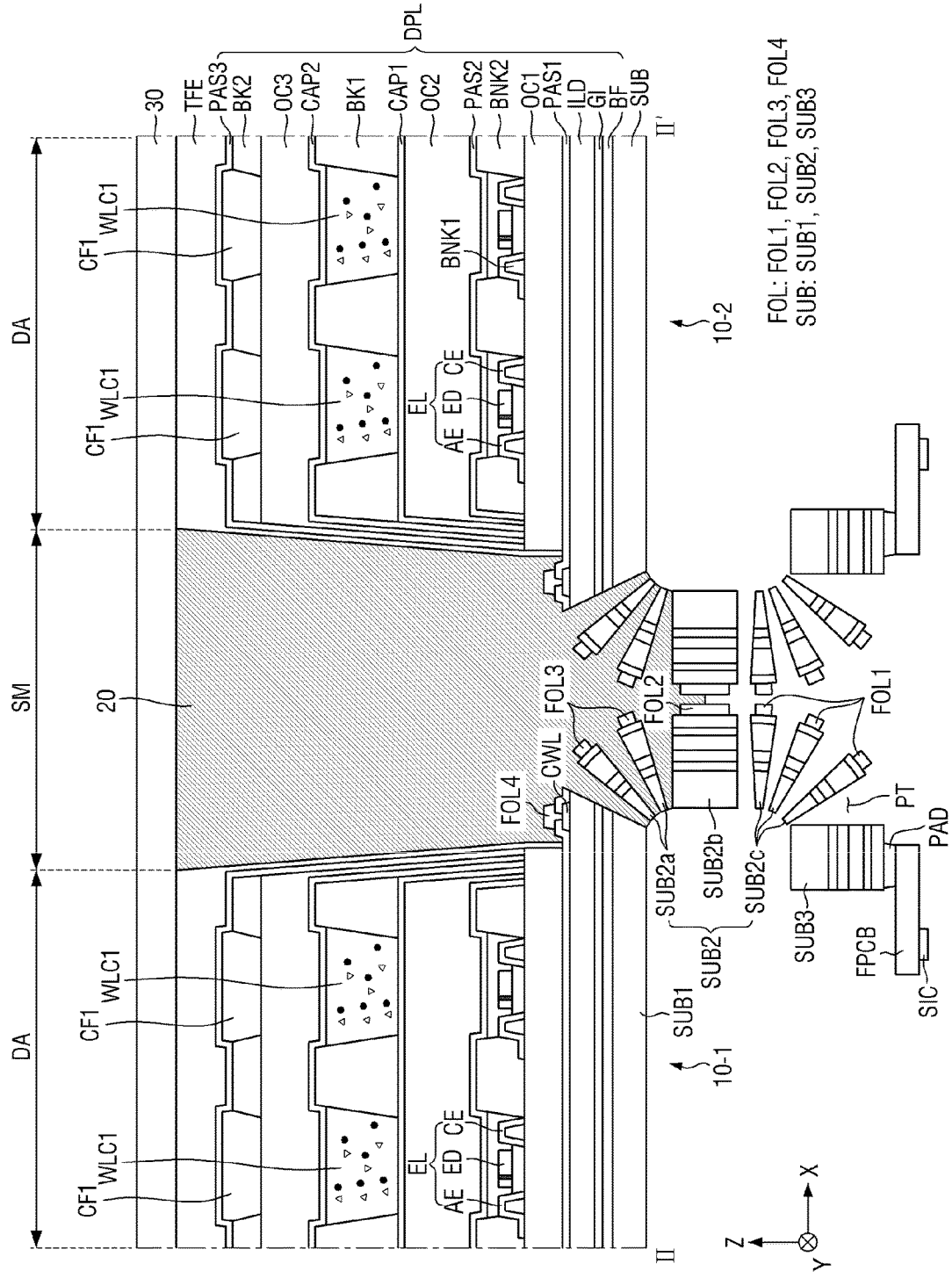
FIG. 17 is a cross-sectional view of an example taken along the line II-II' of FIG. 1.
Figure 18:
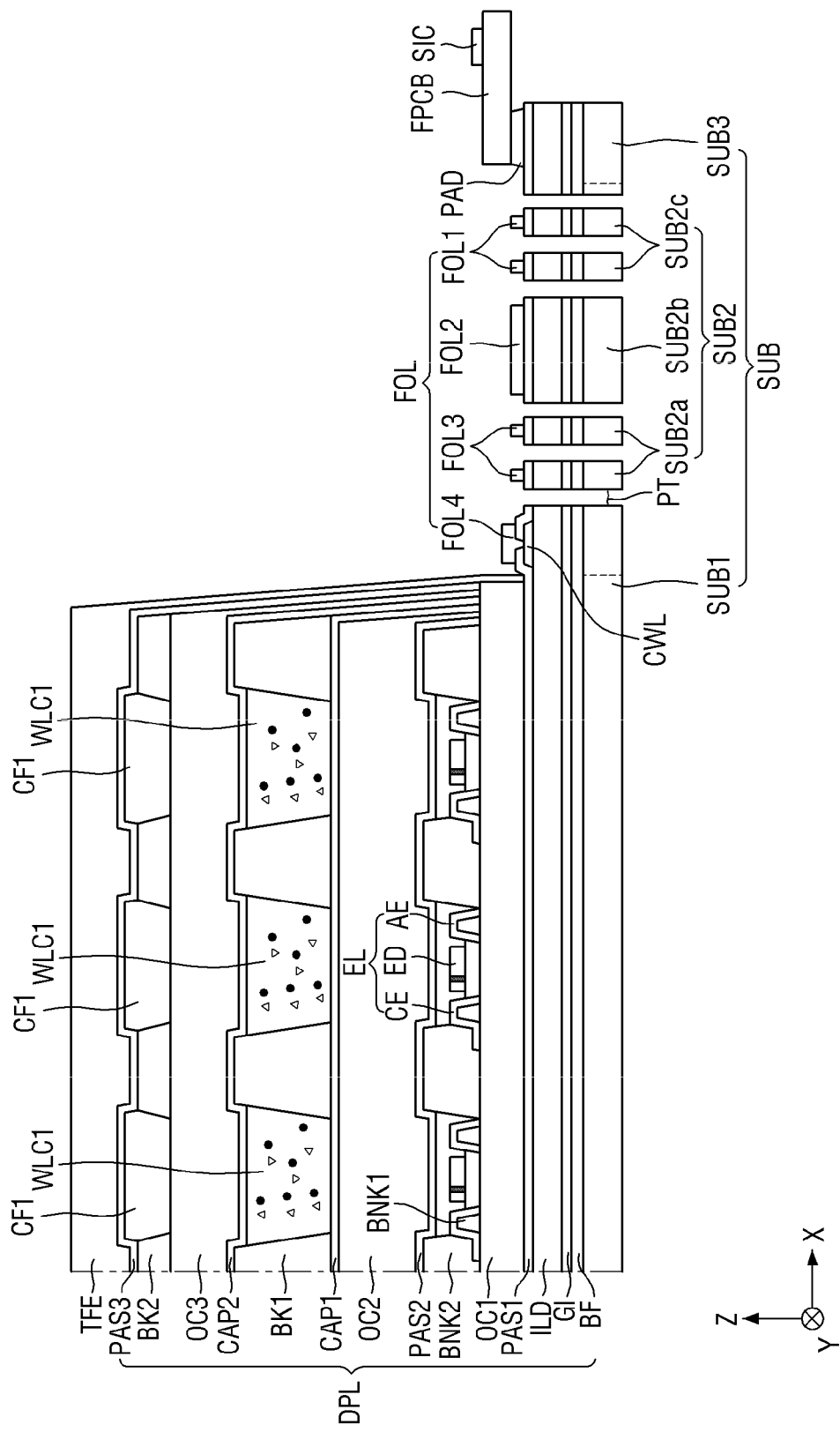
FIG. 18 is a cross-sectional view showing a display device before bending in the tiled display device of FIG. 17.

FIG. 17 is a cross-sectional view of an example taken along the line II-II' of FIG. 1, and FIG. 18 is a cross-sectional view showing a display device before bending in the tiled display device of FIG. 17. The tiled display device of FIGS. 17 and 18 is different from the tiled display device of FIGS. 4 and 6 in the configuration of the substrate SUB, and the same configurations as those described above will be described briefly, or a description thereof will be omitted.

Referring to FIGS. 17 and 18, each of the first and second display devices 10-1 and 10-2 may include the substrate SUB, the display layer DPL, the encapsulation layer TFE, the connection line CWL, the pad portion PAD, the fan-out line FOL, the plurality of pattern holes PT, the flexible film FPCB, and the source driver SIC.

The substrate SUB may be a base substrate or a base member, and may be made of an insulating material such as a polymer resin. The substrate SUB may be a flexible substrate that can be bent, folded and/or rolled. For example, the substrate SUB may include a glass material or a metal material, but is not limited thereto. For another example, the substrate SUB may include polyimide (PI).

The substrate SUB may include a first portion SUB1, a second portion SUB2, and a third portion SUB3.

The first portion SUB1 may correspond to the display area DA of the display device 10. The thin film transistor layer TFTL, the light emitting element layer EML, the wavelength conversion layer WLCL, the color filter layer CFL, and the encapsulation layer TFE may be sequentially stacked on the first portion SUB1. Therefore, the first portion SUB1 may support the display layer DPL of the display device 10.

The second portion SUB2 may extend from one side of the first portion SUB1. The buffer layer BF, the gate insulating layer GI, the interlayer insulating layer ILD, and the first passivation layer PAS1 may be sequentially stacked on the second portion SUB2. The second portion SUB2 may be bent after the display layer DPL is stacked on the first portion SUB1 of the substrate SUB. The second portion SUB2 may be disposed between the first portion SUB1 and the third portion SUB3. The second portion SUB2 may support the fan-out line FOL that connects the pad portion PAD disposed on the third portion SUB3 to the connection line CWL disposed on the first portion SUB1.

The second portion SUB2 may include a second-first portion SUB2a, a second-second portion SUB2b, and a second-third portion SUB2c.

The second-first portion SUB2a may extend from the first portion SUB1 of the substrate SUB. In FIG. 17, the second-first portion SUB2a of the substrate SUB may be bent along the bending axis in the first direction (X-axis direction).

The second-second portion SUB2b may extend from the second-first portion SUB2a. The second-second portion SUB2b may be disposed between the second-first portion SUB2a and the second-third portion SUB2c, and may not be bent.

The second-third portion SUB2c may extend from the second-second portion SUB2b of the substrate SUB. In FIG. 17, the second-third portion SUB2c of the substrate SUB may be bent along the bending axis in the first direction (X-axis direction).

The second portion SUB2 may be disposed in the coupling area SM. The tiled display device TD of FIG. 17 may include the second-first portion SUB2a and the second-third portion SUB2c that are bent, and the second-second portion SUB2b that is not bent, thereby further reducing the width of the coupling area SM compared to the tiled display device TD of the previously described embodiments. Accordingly, in the tiled display device TD, the coupling area SM may be prevented from being recognized by the user, thereby removing a sense of disconnection between the plurality of display devices 10 and improving a sense of immersion in an image.

The third portion SUB3 may be disposed at the edge of the substrate SUB. The third portion SUB3 may overlap the first portion SUB1 in the thickness direction or the Z-axis direction by the bending of the second portion SUB2. The buffer layer BF, the gate insulating layer GI, the interlayer insulating layer ILD, and the first passivation layer PAS1 may be sequentially stacked on the third portion SUB3. The third portion SUB3 may support the pad portion PAD disposed on the first passivation layer PAS1.

The plurality of pattern holes PT may penetrate the second-first portion SUB2a and the second-third portion SUB2c of the substrate SUB, and may not penetrate the second-second portion SUB2b. The plurality of pattern holes PT may further penetrate the buffer layer BF, the gate insulating layer GI, the interlayer insulating layer ILD, and the first passivation layer PAS1 stacked on the second-first portion SUB2a and the second-third portion SUB2c of the substrate SUB, thereby improving the bending strength of the second-first portion SUB2a and the second-third portion SUB2c of the substrate SUB.

Figure 19:
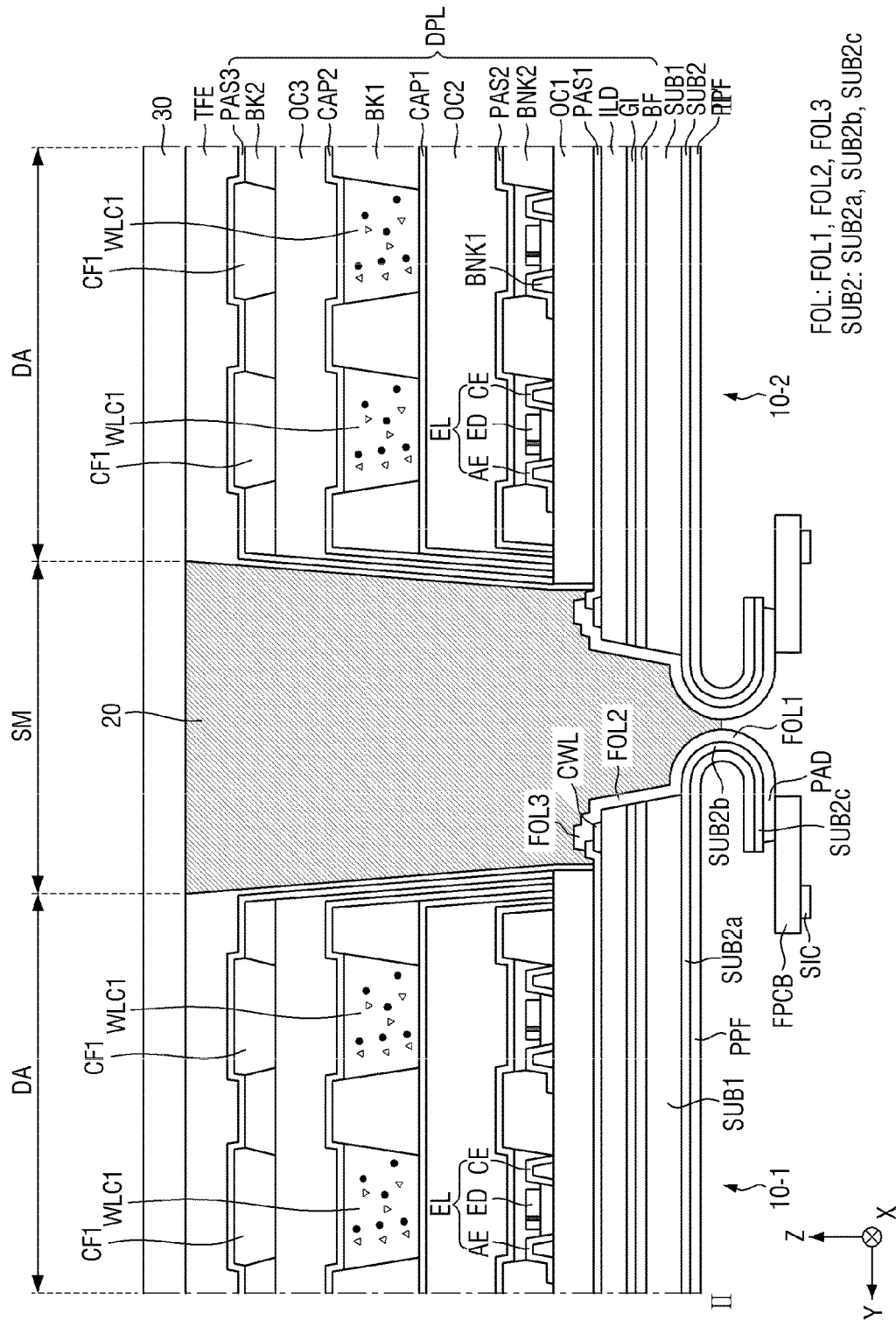
FIG. 19 is a cross-sectional view of an example taken along the line II-II' of FIG. 1.

FIG. 19 is a cross-sectional view of an example taken along the line II-II' of FIG. 1. The tiled display device of FIG. 19 is different from the tiled display device of FIG. 4 in the configuration of a first substrate SUB1 and in that it further includes a second substrate SUB2, and the same configurations as those described above will be described briefly, or a description thereof will be omitted.

Referring to FIG. 19, each of the first and second display devices 10-1 and 10-2 may include the first substrate SUB1, the second substrate SUB2, a cover film PPF, the display layer DPL, the encapsulation layer TFE, the connection line CWL, the pad portion PAD, the fan-out line FOL, the flexible film FPCB, and the source driver SIC. In some embodiments, the display device 10 also includes the plurality of pattern holes PT.

The first substrate SUB1 may be a base substrate or a base member, and may be made of an insulating material such as a polymer resin. The substrate SUB may be a flexible substrate that can be bent, folded and/or rolled. For example, the substrate SUB may include a glass material or a metal material, but is not limited thereto. The first substrate SUB1 may correspond to the display area DA of the display device 10. The thin film transistor layer TFTL, the light emitting element layer EML, the wavelength conversion layer WLCL, the color filter layer CFL, and the encapsulation layer TFE may be sequentially stacked on the first substrate SUB1. Therefore, the first substrate SUB1 may support the display layer DPL of the display device 10.

The second substrate SUB2 may include a first portion SUB2a, a second portion SUB2b, and a third portion SUB2c. For example, the second substrate SUB2 may include polyimide (PI).

The first portion SUB2a may be disposed below the first substrate SUB1. The first portion SUB2a of the second substrate SUB2 may correspond to the display area DA and may support the display layer DPL.

The second portion SUB2b may extend from one side of the first portion SUB2a. The second portion SUB2b may be bent after the display layer DPL is stacked on the first substrate SUB1. In FIG. 19, the second portion SUB2b of the second substrate SUB2 may be bent along the bending axis in the first direction (X-axis direction). The second portion SUB2b may be disposed between the first portion SUB2a and the third portion SUB2c. The second portion SUB2b may support the fan-out line FOL that connects the pad portion PAD disposed on the third portion SUB2c to the connection line CWL disposed on the first substrate SUB1.

The second portion SUB2b may be disposed in the coupling area SM. The second portion SUB2b is bent in the coupling area SM, so that the flexible film FPCB and the source driver SIC may be bonded at the rear surface of the substrate SUB, and the width of the coupling area SM or the distance between the plurality of display devices 10 may be small enough that it is not recognized by the user. Accordingly, in the tiled display device TD, the coupling area SM may be prevented from being recognized by the user, thereby removing a sense of disconnection between the plurality of display devices 10 and improving a sense of immersion in an image.

The third portion SUB2c may be disposed at the edge of the second substrate SUB2. The third portion SUB2c may overlap the first portion SUB2a in the thickness direction or the Z-axis direction by the bending of the second portion SUB2b. The third portion SUB2c may support the pad portion PAD.

The cover film PPF may be disposed on the bottom surface of the second substrate SUB2. The cover film PPF may cover and protect the bottom surfaces of the first to third portions SUB2a, SUB2b, and SUB2c of the second substrate SUB2. A part of the cover film PPF may be bent with the second portion SUB2b of the second substrate SUB2.

The fan-out line FOL may include a first portion FOL1, a second portion FOL2, and a third portion FOL3.

The first portion FOL1 of the fan-out line FOL may be connected to the pad portion PAD disposed on the third portion SUB2c of the second substrate SUB2. The first portion FOL1 of the fan-out line FOL may extend on the upper portion of the second portion SUB2b of the second substrate SUB2.

The second portion FOL2 of the fan-out line FOL may extend along the side surface of the first substrate SUB1. The second portion FOL2 of the fan-out line FOL may extend along the side surfaces of the buffer layer BF, the gate insulating layer GI, and the interlayer insulating layer ILD disposed on the first substrate SUB1. The second portion FOL2 of the fan-out line FOL may extend along the side surface of the interlayer insulating layer ILD to the edge of the upper portion of the first passivation layer PAS1.

The third portion FOL3 of the fan-out line FOL may be disposed on the first passivation layer PAS1 and connected to the connection line CWL through a contact hole provided in the first passivation layer PAS1.

Figure 20:
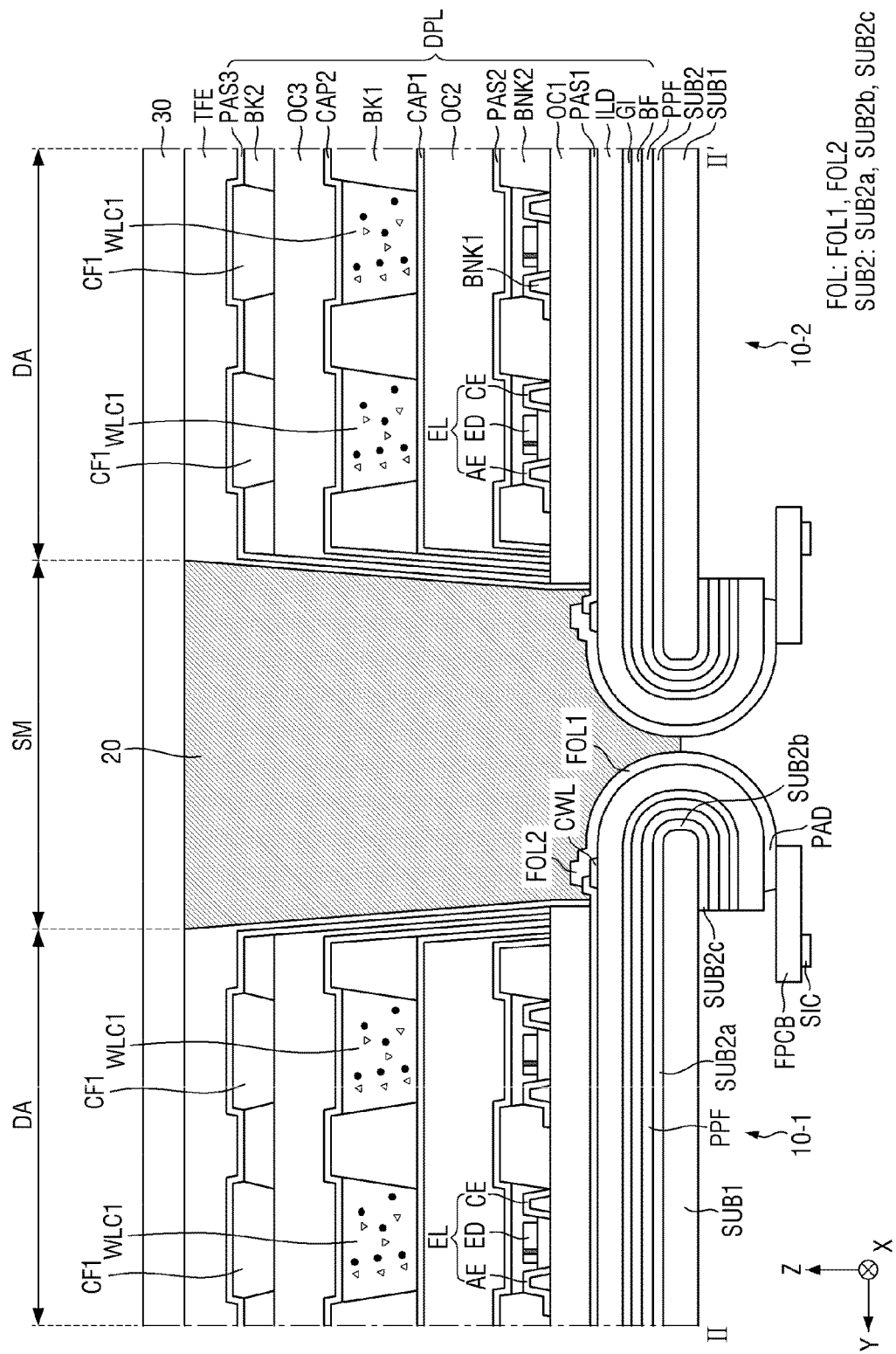
FIG. 20 is a cross-sectional view of an example taken along the line II-II' of FIG. 1.

FIG. 20 is a cross-sectional view of an example taken along the line II-II' of FIG. 1. The tiled display device of FIG. 20 is different from the tiled display device of FIG. 4 in the configuration of the first substrate SUB1 and in that it further includes a second substrate SUB2, and the same configurations as those described above will be described briefly, or a description thereof will be omitted.

Referring to FIG. 20, each of the first and second display devices 10-1 and 10-2 may include the first substrate SUB1, the second substrate SUB2, a cover film PPF, the display layer DPL, the encapsulation layer TFE, the connection line CWL, the pad portion PAD, the fan-out line FOL, the flexible film FPCB, and the source driver SIC. In some embodiments, the display device 10 also includes the plurality of pattern holes PT.

The first substrate SUB1 may be a base substrate or a base member, and may be made of an insulating material such as a polymer resin. The substrate SUB may be a flexible substrate that can be bent, folded and/or rolled. For example, the substrate SUB may include a glass material or a metal material, but is not limited thereto. The first substrate SUB1 may correspond to the display area DA of the display device 10. The second substrate SUB2, the cover film PPF, the thin film transistor layer TFTL, the light emitting element layer EML, the wavelength conversion layer WLCL, the color filter layer CFL, and the encapsulation layer TFE may be sequentially stacked on the first substrate SUB1. Therefore, the first substrate SUB1 may support the display layer DPL of the display device 10.

The second substrate SUB2 may include a first portion SUB2a, a second portion SUB2b, and a third portion SUB2c. For example, the second substrate SUB2 may include polyimide (PI).

The first portion SUB2a may be disposed on the top surface of the first substrate SUB1. The first portion SUB2a of the second substrate SUB2 may correspond to the display area DA and may support the display layer DPL.

The second portion SUB2b may extend from one side of the first portion SUB2a. The second portion SUB2b may be bent after the display layer DPL is stacked on the first substrate SUB1. In FIG. 20, the second portion SUB2b of the second substrate SUB2 may be bent along the bending axis in the first direction (X-axis direction). The second portion SUB2b may be supported by the side surface of the first substrate SUB1. The second portion SUB2b may be disposed between the first portion SUB2a and the third portion SUB2c. The second portion SUB2b may support the fan-out line FOL that connects the pad portion PAD disposed on the third portion SUB2c to the connection line CWL disposed on the first substrate SUB1.

The second portion SUB2b may be disposed in the coupling area SM. The second portion SUB2b is bent in the coupling area SM, so that the flexible film FPCB and the source driver SIC may be bonded at the rear surface of the substrate SUB, and the width of the coupling area SM or the distance between the plurality of display devices 10 may be small enough that it is not recognized by the user. Accordingly, in the tiled display device TD, the coupling area SM may be prevented from being recognized by the user, thereby removing a sense of disconnection between the plurality of display devices 10 and improving a sense of immersion in an image.

The third portion SUB2c may be disposed at the edge of the second substrate SUB2. The third portion SUB2c may overlap the first portion SUB2a in the thickness direction or the Z-axis direction by the bending of the second portion SUB2b. The third portion SUB2c may be attached to the bottom surface of the first portion SUB2a (e.g., with the first substrate SUB1 interposed therebetween) by the bending of the second portion SUB2b. The third portion SUB2c may support the pad portion PAD.

The cover film PPF may be disposed on the top surface of the second substrate SUB2. The cover film PPF may cover and protect the top surfaces of the first to third portions SUB2a, SUB2b, and SUB2c of the second substrate SUB2. A part of the cover film PPF may be bent with the second portion SUB2b of the second substrate SUB2.

The fan-out line FOL may include a first portion FOL1 and a second portion FOL2. The first portion FOL1 of the fan-out line FOL may be connected to the pad portion PAD disposed on the third portion SUB2c of the second substrate SUB2. The first portion FOL1 of the fan-out line FOL may extend on the upper portion of the second portion SUB2b of the second substrate SUB2. The second portion FOL2 of the fan-out line FOL may be connected to the connection line CWL through a contact hole provided in the first passivation layer PAS1.

Figure 21:
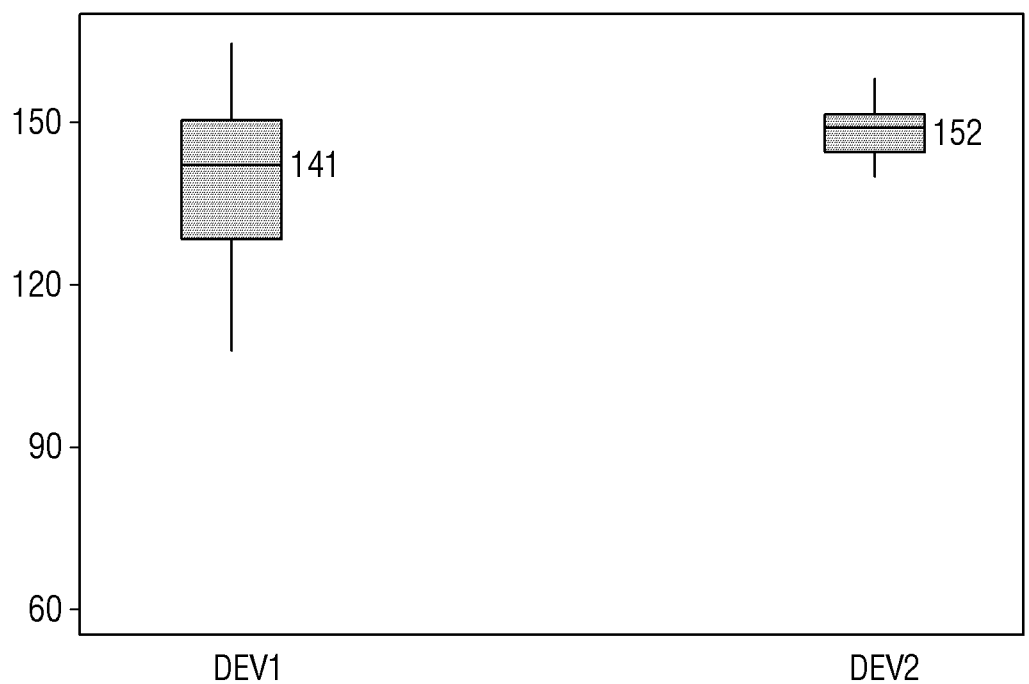
FIG. 21 is a graph illustrating bending strength of a tiled display device according to one embodiment.

FIG. 21 is a graph illustrating bending strength of a tiled display device according to one embodiment. For example, FIG. 21 shows the bending strength of a first glass member DEV1 not including a plurality of pattern holes and a second glass member DEV2 including the plurality of pattern holes PT shown in FIG. 4. Here, a proportion of the area of the plurality of pattern holes PT to the area of the second glass member DEV2 may be 30 to 50 percent (%).

Referring to FIG. 21, an average value of the bending strength of the first glass member DEV1 is 141 (MPa), and an average value of the bending strength of the second glass member DEV2 is 152 (MPa). In addition, ring-on-ring (ROR) strength of the first glass member DEV1 is 317.02 (MPa), and ring-on-ring (ROR) strength of the second glass member DEV2 is 313.12 (MPa).

Accordingly, the tiled display device TD includes the plurality of pattern holes PT provided in the second portion SUB2 of the substrate SUB, thereby improving ring-on-ring (ROR) strength and bending strength of the substrate SUB.

What is claimed is:

1. A tiled display device comprising:
a plurality of display devices comprising a plurality of display areas comprising a plurality of pixels, and a coupling area between adjacent display areas from among the plurality of display areas,
wherein each of the plurality of display devices comprises:
a substrate comprising a first portion configured to support the display area, a second portion extending from the first portion to be bent, and a third portion extending from the second portion;
a thin film transistor layer on the first portion, the second portion, and the third portion of the substrate and comprising a thin film transistor;
a display layer comprising the thin film transistor on the first portion of the substrate, and the plurality of pixels;
a connection line at an edge of the first portion of the substrate and connected to the plurality of pixels;
a pad portion on the third portion of the substrate;
a fan-out line on the second portion of the substrate and connected between the pad portion and the connection line; and
a plurality of pattern holes penetrating the thin film transistor layer and the second portion of the substrate.

2. The tiled display device of claim 1, wherein the second portion of the substrate of each of the plurality of display devices is at the coupling area.

3. The tiled display device of claim 1, wherein the third portion of the substrate overlaps the first portion of the substrate in a thickness direction of the substrate.

4. The tiled display device of claim 1, wherein each of the plurality of display devices further comprises:
a flexible film on the pad portion; and
a source driver on the flexible film to drive the plurality of pixels.

5. The tiled display device of claim 1, wherein the fan-out line is bent to bypass the plurality of pattern holes in a plan view.

6. The tiled display device of claim 1, wherein the second portion of the substrate is bent along a bending axis in a first direction, and
a width of each of the plurality of pattern holes in the first direction is greater than a width of each of the plurality of pattern holes in a second direction crossing the first direction.

7. The tiled display device of claim 1, wherein the plurality of pattern holes have a circular shape.

8. The tiled display device of claim 1, wherein each of the plurality of display devices further comprises a protective film covering the fan-out line.

9. The tiled display device of claim 1, wherein a thickness of the second portion of the substrate is less than a thickness of the first portion of the substrate or a thickness of the third portion of the substrate.

10. The tiled display device of claim 9, wherein a bottom surface of the second portion of the substrate has a stepped portion recessed from a bottom surface of the first portion of the substrate.

11. The tiled display device of claim 10, wherein each of the plurality of display devices further comprises a support part configured to support the second portion of the substrate and to attach one surface of the third portion of the substrate to one surface of the first portion of the substrate.

12. The tiled display device of claim 9, wherein a top surface of the second portion of the substrate has a stepped portion recessed from a top surface of the first portion of the substrate.

13. The tiled display device of claim 1, wherein each of the plurality of display devices further comprises a filling part filled in the plurality of pattern holes.

14. The tiled display device of claim 13, wherein the fan-out line extends on a top surface of the filling part.

15. The tiled display device of claim 1, wherein the second portion of the substrate comprises:
   a second-first portion extending from the first portion of the substrate to be bent;
   a second-second portion extending from the second-first portion; and
   a second-third portion extending from the second-second portion to be bent, and
   wherein the plurality of pattern holes are configured to penetrate the second-first portion and the second-third portion.

16. A display device comprising:
   a substrate comprising a first portion, a second portion extending from the first portion to be bent, and a third portion extending from the second portion;
   a thin film transistor layer on the first portion, the second portion, and the third portion of the substrate and comprising a thin film transistor;
   a light emitting element layer on the thin film transistor layer on the first portion of the substrate and comprising a light emitting element connected to the thin film transistor;
   a wavelength conversion layer on the light emitting element layer to convert a peak wavelength of light provided from the light emitting element;
   a connection line at an edge on the first portion of the substrate and connected to the thin film transistor;
   a pad portion on the third portion of the substrate;
   a fan-out line on the second portion of the substrate and connected between the pad portion and the connection line; and
   a plurality of pattern holes penetrating the thin film transistor layer and the second portion of the substrate.

17. The display device of claim 16, wherein the light emitting element layer comprises:
   a first electrode on the thin film transistor layer;
   a second electrode at a same layer as the first electrode and spaced from the first electrode; and
   a light emitting diode located between the first electrode and the second electrode.

18. The display device of claim 16, wherein the wavelength conversion layer comprises:
   a first wavelength conversion part configured to convert the peak wavelength of light provided from the light emitting element into a first peak wavelength;
   a second wavelength conversion part configured to convert the peak wavelength of light provided from the light emitting element into a second peak wavelength different from the first peak wavelength; and
   a light transmission part configured to allow the light to pass therethrough while maintaining the peak wavelength of the light provided from the light emitting element.

19. The display device of claim 16, wherein a thickness of the second portion of the substrate is less than a thickness of the first portion of the substrate or a thickness of the third portion of the substrate.

20. The display device of claim 19, wherein a bottom surface of the second portion of the substrate has a stepped portion recessed from a bottom surface of the first portion of the substrate.

21. The display device of claim 20, further comprising a support part configured to support the second portion of the substrate and to attach one surface of the third portion of the substrate to one surface of the first portion of the substrate.

22. The display device of claim 19, wherein a top surface of the second portion of the substrate has a stepped portion recessed from a top surface of the first portion of the substrate.

23. The display device of claim 16, further comprising a filling part filled in the plurality of pattern holes, wherein the fan-out line extends on a top surface of the filling part.

* * * * *